(12) United States Patent
Hara

(10) Patent No.: US 7,760,584 B2
(45) Date of Patent: Jul. 20, 2010

(54) SEMICONDUCTOR MEMORY DEVICE, SEMICONDUCTOR DEVICE, AND DATA WRITE METHOD

(75) Inventor: Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/499,136

(22) Filed: Jul. 8, 2009

(65) Prior Publication Data

US 2009/0273982 A1 Nov. 5, 2009

Related U.S. Application Data

(62) Division of application No. 11/839,915, filed on Aug. 16, 2007, now Pat. No. 7,570,522.

(30) Foreign Application Priority Data

Aug. 18, 2006 (JP) ............................. 2006-223374

(51) Int. Cl.
*G11C 8/00* (2006.01)
(52) U.S. Cl. ............................. 365/230.08; 365/189.05
(58) Field of Classification Search ............ 365/230.08, 365/189.05, 185.22
See application file for complete search history.

(56) References Cited

U.S. PATENT DOCUMENTS

| 6,484,270 | B1 | 11/2002 | Odani |
| 6,523,755 | B2 | 2/2003 | Shinohara |
| 6,556,504 | B2 | 4/2003 | Kwon et al. |
| 6,567,320 | B2 * | 5/2003 | Ando ............... 365/189.12 |
| 6,785,185 | B2 | 8/2004 | Sumitani et al. |
| 6,791,877 | B2 | 9/2004 | Miura et al. |
| 7,068,550 | B2 * | 6/2006 | La ............... 365/195 |
| 2001/0007538 | A1 * | 7/2001 | Leung ............... 365/222 |
| 2002/0015344 | A1 * | 2/2002 | Leung et al. ............... 365/207 |
| 2003/0209740 | A1 | 11/2003 | Miyamoto et al. |
| 2008/0001200 | A1 | 1/2008 | Honda |

FOREIGN PATENT DOCUMENTS

| JP | 5-81145 | 4/1993 |
| JP | 2005-182983 | 7/2005 |

* cited by examiner

*Primary Examiner*—Anh Phung
(74) *Attorney, Agent, or Firm*—Oblon, Spivak, McClelland, Maier & Neustadt, L.L.P.

(57) ABSTRACT

A semiconductor memory device includes an output buffer which outputs an enable signal which makes an external memory device operable, an address buffer which generates an address at which data is held in the external memory device, an input buffer which receives the data held at the address from the external memory device, and a write data buffer which holds the data received by the input buffer, and writes the data in a plurality of memory cells at once. Whenever the write data buffer writes data, the input buffer receives, from the external memory, the data having a size which is written in the memory cells at once.

15 Claims, 18 Drawing Sheets

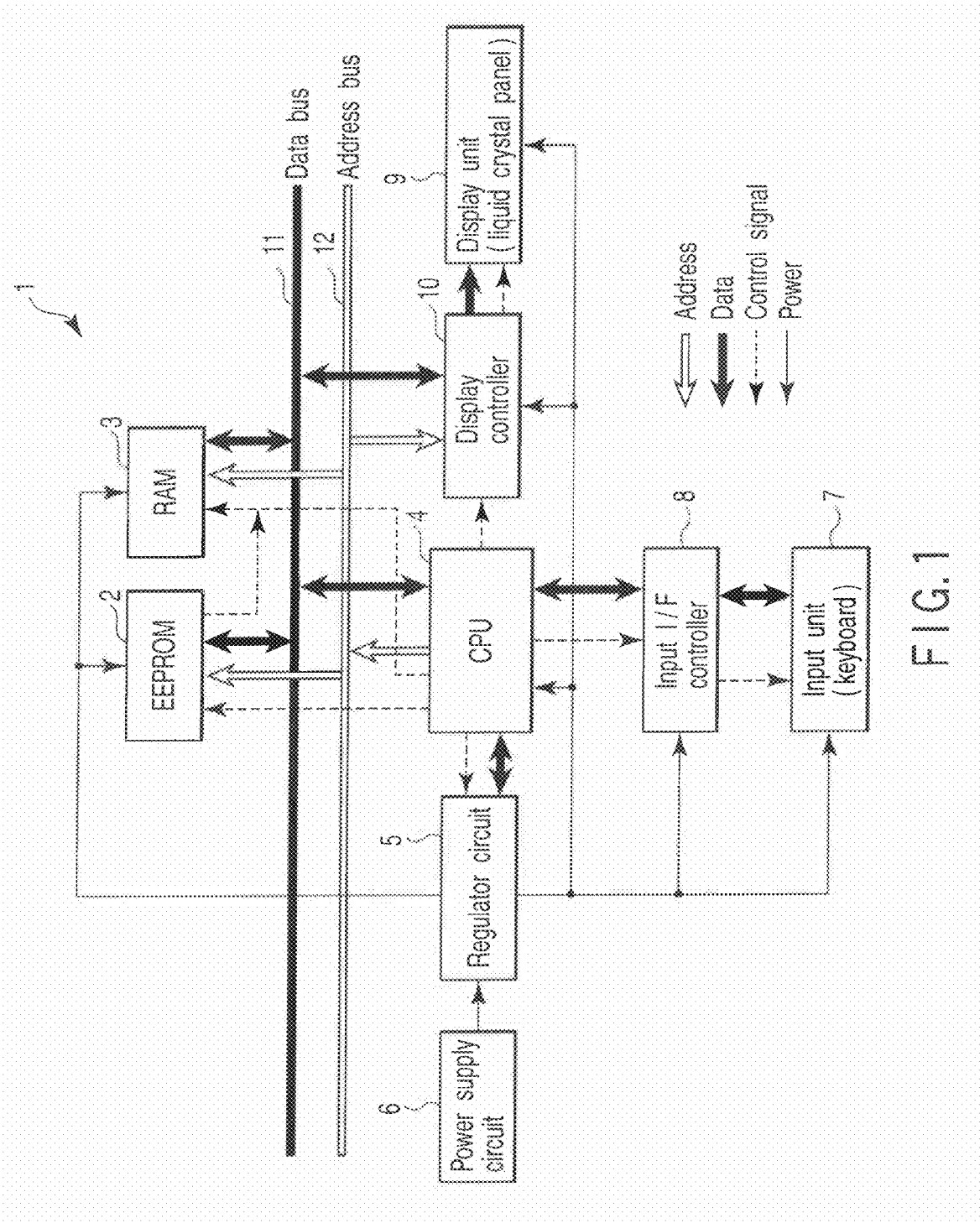
F I G. 1

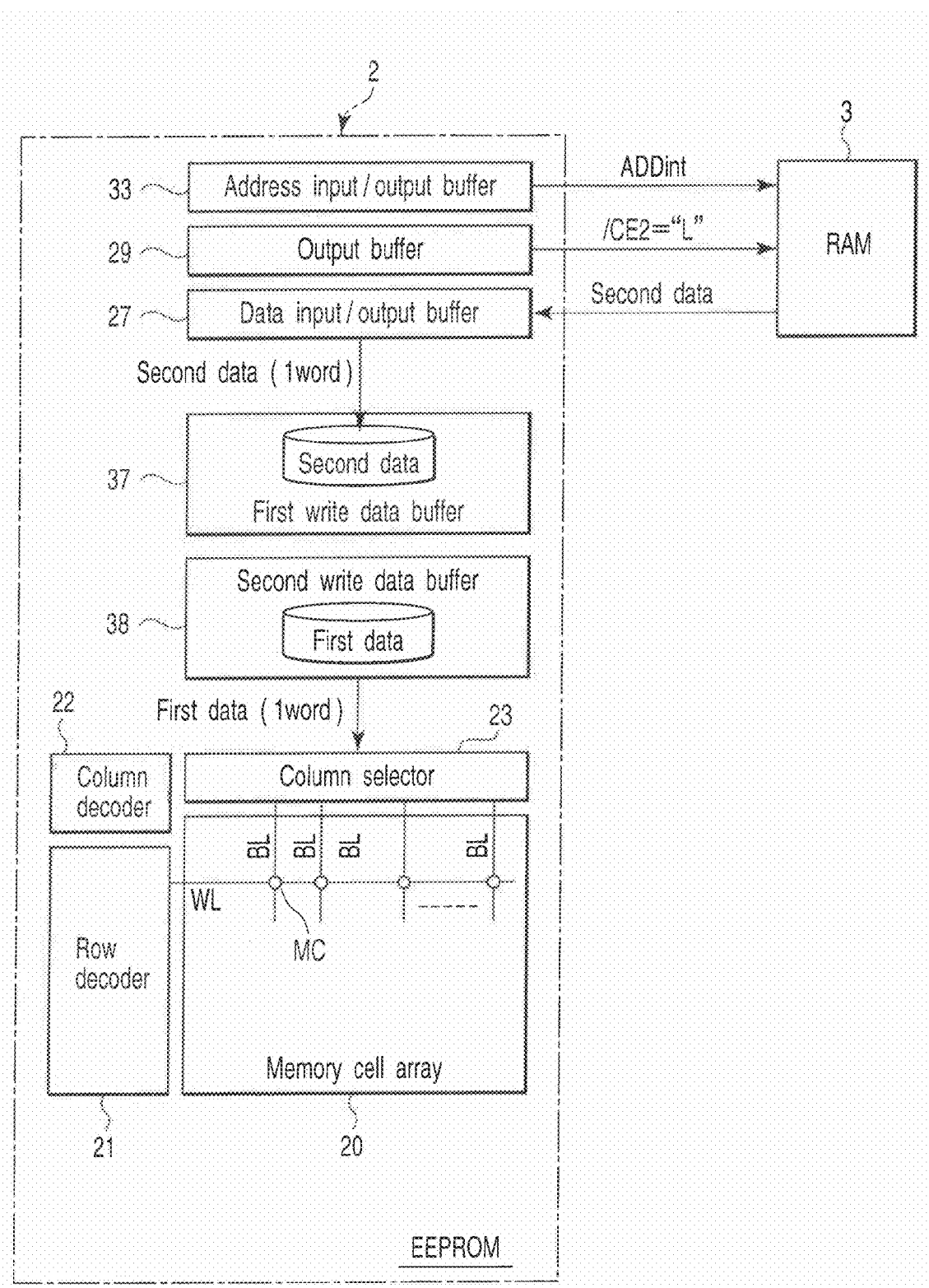
F I G. 14

SEMICONDUCTOR MEMORY DEVICE, SEMICONDUCTOR DEVICE, AND DATA WRITE METHOD

CROSS-REFERENCE TO RELATED APPLICATIONS

This application is a divisional of and claims the benefit of priority under 35 U.S.C. §120 from U.S. application Ser. No. 11/839,915, filed Aug. 16, 2007 now U.S. Pat. No. 7,570,522, issued on Aug. 4, 2009, and claims the benefit of priority under 35 U.S.C. §119 of Japanese Patent Application No. 2006-223374, filed Aug. 18, 2006, the entire contents of which are incorporated herein by reference.

BACKGROUND OF THE INVENTION

1. Field of the Invention

The present invention relates to a semiconductor memory device, semiconductor device, and data write method. For example, the present invention relates to a semiconductor memory including a MOS transistor having a floating gate and control gate.

2. Description of the Related Art

An EEPROM (Electrically Erasable and Programmable ROM) is conventionally known as a nonvolatile semiconductor memory in which data is electrically programmable. In an application system, the EEPROM is sometimes used to store a program for operating an application. In this case, the program is written in the EEPROM when the system is manufactured.

Although the amount of data written in this case is a relatively large volume, e.g., 128 Mbits, the amount of data that can be written in the EEPROM by one write command is, e.g., about eight words (=128 bits). Therefore, it is necessary to repetitively input the write commands to the EEPROM (e.g., Jpn. Pat. Appln. KOKAI Publication Nos. 2005-182983 and 5-81145). This makes data write very time-consuming.

BRIEF SUMMARY OF THE INVENTION

A semiconductor memory device according to the first aspect of the present invention configured to connect to an external memory device, comprises a memory cell array in which a plurality of memory cells each including a charge storage layer and a control gate formed on the charge storage layer are arranged in a matrix, a word line which connects the control gates of the memory cells on the same row in the memory cell array, an output buffer which outputs, to the external memory device, an enable signal which makes the external memory device operable, an address buffer which outputs, to the external memory device, an address of data to be read out from the external memory device, an input buffer which receives the data held at the address output from the address buffer, from the external memory device made operable by the enable signal, and a write data buffer which holds the data received by the input buffer, and writes the data in the memory cells connected to the same word line at once, wherein whenever the write data buffer writes data in the memory cells, the input buffer receives, from the external memory device, the data having a size which is written in the memory cells at once.

A semiconductor device according to the second aspect of the present invention comprises a first semiconductor chip which is made operable by a first enable signal, and includes a first semiconductor memory device configured to hold data, a second semiconductor chip which is packaged in the same package as the first semiconductor chip and made operable by a second enable signal, and includes a second semiconductor memory device including a memory cell having a charge storage layer and a control gate formed on the charge storage layer, a data bus which connects the first semiconductor chip and the second semiconductor chip such that the first semiconductor chip and the second semiconductor chip are adapted to communicate with each other, a first external pin electrically connected to the data bus, and configured to receive the first enable signal from outside, a second external pin electrically connected to the data bus, and configured to receive the second enable signal from outside, a third external pin electrically connected to the data bus, shared by the first semiconductor chip and the second semiconductor chip, and configured to receive the data from outside, and a fourth external pin shared by the first semiconductor chip and the second semiconductor chip, and configured to receive an address signal from outside, wherein when writing the data in the first semiconductor memory device, the first semiconductor chip is made operable by the first enable signal input to the first external pin, and operates in accordance with the data input to the third external pin and the address signal input to the fourth external pin, and when the first enable signal generated by the second semiconductor chip makes the first semiconductor chip operable, and the address signal generated by the second semiconductor chip is supplied to the first semiconductor chip, the second semiconductor memory device writes the data held in the first semiconductor memory device into the memory cell.

A data write method according to the third aspect of the present invention configured to connect to an external memory device, and having a plurality of memory cells each having a charge storage layer and a control gate formed on the charge storage layer, the data write method comprises writing data having a first data size in the external memory device, causing the semiconductor memory device to generate an execution flag indicating that a write operation is being performed, after the write to the external memory device is complete, causing the semiconductor memory device to make the external memory device operable, after the execution flag is generated, causing a voltage generator of the semiconductor memory device to generate a first internal voltage for write, causing the semiconductor memory device to read out the data from the external memory device, for each second data size smaller than the first data size, writing the data in the memory cells for each second data size by using the first internal voltage, causing the voltage generator to generate a second internal voltage for verify, after all the data is completely written in the memory cells, causing the semiconductor memory device to read out the data from the external memory device again for each second data size, verifying the data written in the memory cells by using the second internal voltage and the data read out from the external memory device again, and stopping the generation of the execution flag, after all the data is completely verified.

BRIEF DESCRIPTION OF THE SEVERAL VIEWS OF THE DRAWING

FIG. 1 is a block diagram of a memory system according to the first embodiment of the present invention;

FIG. 14 is a block diagram of the EEPROM according to the second embodiment of the present invention, and shows the way data is written;

DETAILED DESCRIPTION OF THE INVENTION

Figure 2:
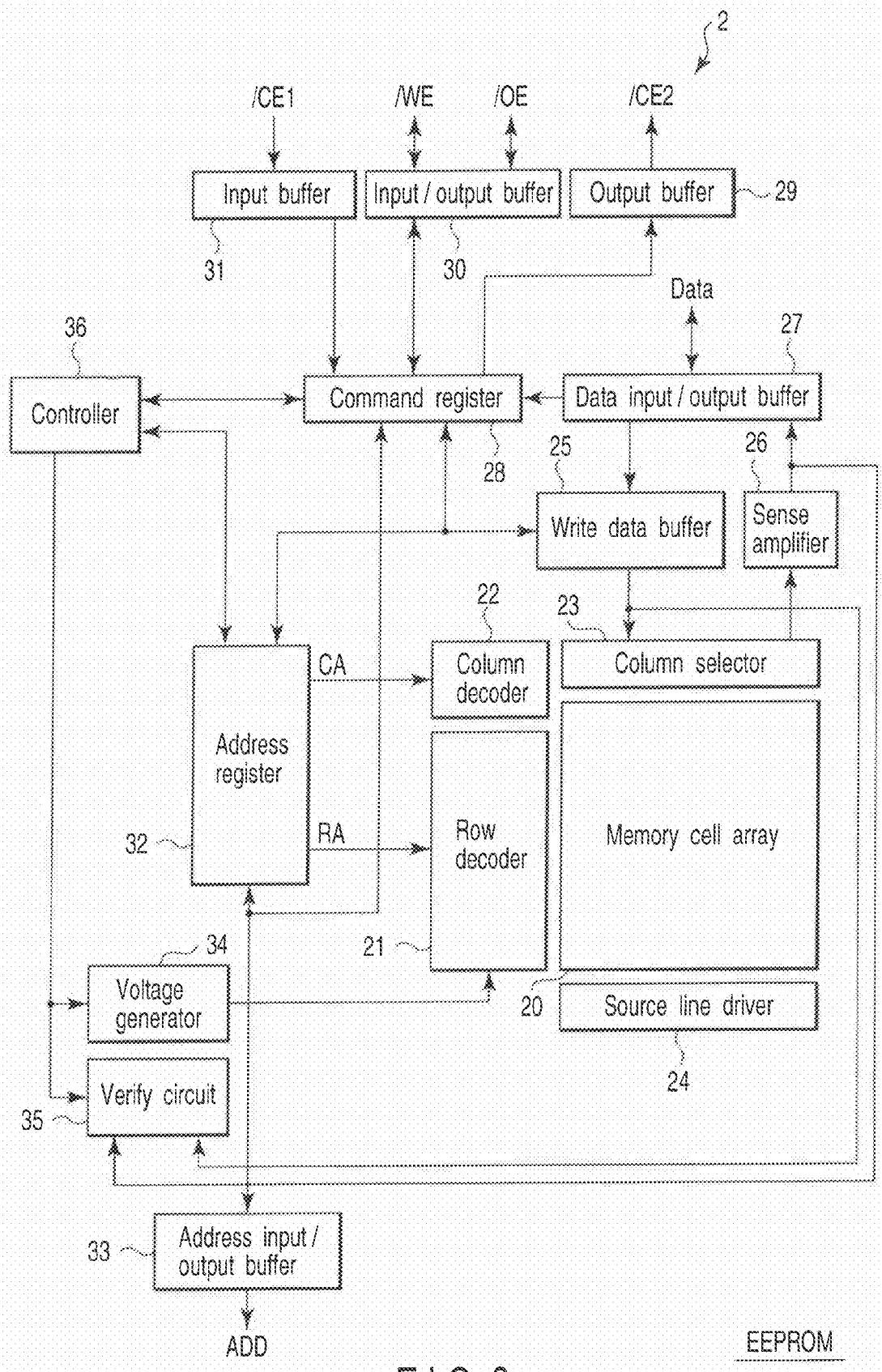
FIG. 2 is a block diagram of an EEPROM according to the first embodiment of the present invention.

Embodiments of the present invention will be explained below with reference to the accompanying drawing. In the following explanation, the same reference numerals denote the same parts throughout the drawing.

First Embodiment

A semiconductor memory device, semiconductor device, and data write method according to the first embodiment of the present invention will be explained below. FIG. 1 is a block diagram of a memory system according to this embodiment.

As shown in FIG. 1, a memory system 1 comprises an EEPROM 2, RAM 3, CPU 4, regulator circuit 5, power supply circuit 6, input unit 7, input interface (I/F) controller 8, display unit 9, display controller 10, data bus 11, and address bus 12. Referring to FIG. 1, the hollow arrows indicate the flow of address signals, the closed arrows indicate the flow of data, the broken-line arrows indicate the flow of control signals, and the solid-line arrows indicate the flow of power supply voltage.

The EEPROM 2 is, e.g., a NOR flash memory, and holds programs required for the system 1 to operate.

Details of the arrangement of the EEPROM will be described later.

The RAM 3 is, e.g., an SRAM or PSRAM (Pseudo SRAM). The RAM 3 may also be a DRAM or the like.

The CPU 4 performs various arithmetic operations by using the programs held in the EEPROM 2 and using the RAM 3 as a work area. The CPU 4 also selects the EEPROM 2 and RAM 3, and controls the operation of each block in the system 1.

The power supply circuit 6 is, e.g., a cell or battery, and generates a predetermined voltage.

The regulator circuit 5 transforms the voltage generated by the power supply circuit 6 into a voltage optimum for each block in the system 1 to operate.

The input unit 7 is, e.g., a keyboard, and accepts inputs from the user of the system 1.

The input I/F controller 8 controls the operation of the input unit 7 under the control of the CPU 4, and transfers data input from the input unit 7 to the CPU 4.

The display unit 9 is, e.g., a liquid crystal panel, and displays, e.g., the results of arithmetic operations performed by the CPU 4.

The display controller 10 controls the operation of the display unit 9 under the control of the CPU 4, and outputs data to be displayed to the display unit 9.

The data bus 11 and address bus 12 interconnect the EEPROM 2, RAM 3, CPU 4, and display controller 10. The data bus 11 and address bus 12 transfer data and address signals to each other.

In the above arrangement, the CPU 4 functions as a host apparatus of the EEPROM 2 and RAM 3. In accordance with requirements of the CPU 4, data is written in and read out from the EEPROM 2 and RAM 3. The EEPROM 2 and RAM 3 are semiconductor devices packaged in different packages, and each have connection pins to the outside. That is, each semiconductor device has a data pin connected to the data bus 11 and used to input and output data, an address pin connected to the address bus 12 and used to input and output address signals, a control pin that receives control signals such as a write enable signal and output enable signal, and a chip select pin that receives a chip enable signal for chip selection as one control signal. Note that the EEPROM 2 can generate a chip enable signal of the RAM 3, and the chip select pin of the RAM 3 can receive this chip enable signal.

The arrangement of the EEPROM 2 will be explained below with reference to FIG. 2. FIG. 2 is a block diagram of the EEPROM 2. As shown in FIG. 2, the EEPROM 2 comprises a memory cell array 20, row decoder 21, column decoder 22, column selector 23, source line driver 24, write data buffer 25, sense amplifier 26, data input/output buffer 27, command register 28, output buffer 29, input/output buffer 30, input buffer 31, address register 32, address input/output buffer 33, voltage generator 34, verify circuit 35, and controller 36.

The memory cell array 20 comprises NOR flash memory cells arranged in a matrix. Each memory cell is connected to a bit line, word line, and source line. The row decoder 21 performs selection in the row direction of the memory cell array 20, i.e., selects a word line. The column decoder 22 performs selection in the column direction of the memory cell array 20. The column selector 23 selects a bit line on the basis of the selecting operation of the column decoder 22, and connects the bit line to the write data buffer 25 or sense amplifier 26. The source line driver 24 applies a voltage to the source line. The sense amplifier 26 senses and amplifies data read out from a memory cell selected by the row decoder 21 and column decoder 22. The write data buffer 25 holds data to be written in memory cells, and writes the data in the memory cells such that data is written in every predetermined number of memory cells at once.

The input buffer 31 receives a chip enable signal /CE1 input from the CPU 4 to the chip select pin, and outputs the chip enable signal /CE1 to the command register 28. The chip enable signal /CE1 makes the EEPROM 2 operable.

The input/output buffer 30 receives a write enable signal /WE and output enable signal /OE input from the CPU 4 to the control pin, and outputs these signals to the command register 28. The write enable signal /WE enables a write operation, and the output enable signal /OE enables data output. The input/output buffer 30 also outputs the write enable signal /WE and output enable signal /OE to the RAM 3.

The output buffer 29 outputs a chip enable signal /CE2 to the RAM 3. The chip enable signal /CE2 enables the RAM 3 to operate.

The data input/output buffer 27 receives data input from the RAM 3 or the like to the data pin, and transfers the data to the write data buffer. The data input/output buffer 27 also outputs data amplified by the sense amplifier 26 outside from the data pin.

The command register 28 holds the chip enable signal /CE1 received by the input buffer 31, and the write enable signal /WE and output enable signal /OE received by the input/output buffer 30. The command register 28 also instructs the output buffer 29 to output the chip enable signal /CE2, and the input/output buffer 30 to output the write enable signal /WE and output enable signal /OE.

The address register 32 outputs a column address CA to the column decoder 22, and a row address RA to the row decoder 21. The column decoder 22 and row decoder 21 respectively select a bit line and word line on the basis of the column address CA and row address RA. The address register 32 also generates an address, and outputs the generated address to the address input/output buffer 33. The address input/output buffer 33 outputs the address generated by the address register 32 to the RAM 3.

The voltage generator 34 generates a voltage. The verify circuit 35 performs a verify operation by using data in the write data buffer and readout data amplified by the sense amplifier. The controller 36 controls the operations of the above circuits.

Figure 3:
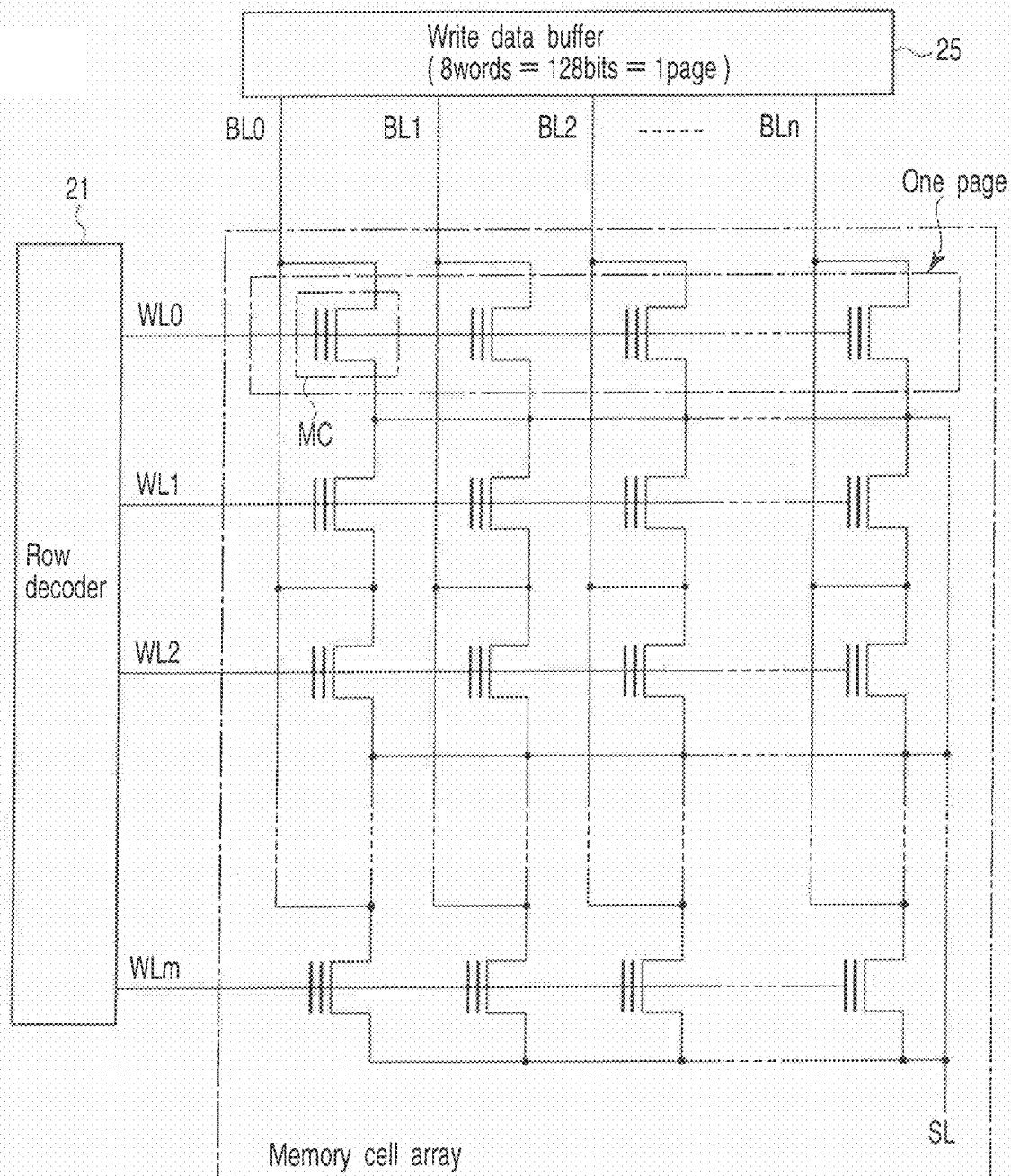
FIG. 3 is a circuit diagram of a memory cell array of the EEPROM according to the first embodiment of the present invention.

The arrangements of the memory cell array 20 and write data buffer 25 will be explained below with reference to FIG. 3. FIG. 3 is a circuit diagram showing the arrangement of the memory cell array 20 and write data buffer 25.

First, the memory cell array 20 will be explained. As shown in FIG. 3, the memory cell array 20 comprises ((m+1)×(n+1)) (m and n are natural numbers) memory cells MC. The memory cell MC is a MOS transistor having a stacked gate including a charge storage layer (e.g., a floating gate) and control gate. The control gates of the memory cells MC on the same row are connected together to one of word lines WL0 to WLm. The drains of the memory cells MC in the same column are connected together to one of bit lines BL0 to BLn. The sources of the memory cells MC are connected together to a source line SL. Note that for the sake of descriptive simplicity, the word lines WL0 to WLm will be collectively called word lines WL in some cases hereinafter, and the bit lines BL0 to BLn will be collectively called bit lines BL in some cases hereinafter. Note also that a set of (n+1) memory cells MC connected to the same word line will be called "a page" hereinafter. "A page" need only be a plurality of memory cells connected to the same word line. However, a set of (n+1) memory cells will be called "a page" in this embodiment for the sake of descriptive simplicity, and the embodiment will be explained by using the case that the data size of one page is 128 bits.

The write data buffer 25 holds a maximum of one page (128 bits) of data to be written in memory cells, and writes data in a plurality of memory cells MC at once. The unit of data to be written at once is, e.g., one word (e.g., 16 bits). That is, data is simultaneously output to bit lines of one word selected by the column selector 23. Accordingly, a one-word write operation must be repeated eight times to write data of one page.

Figure 4:
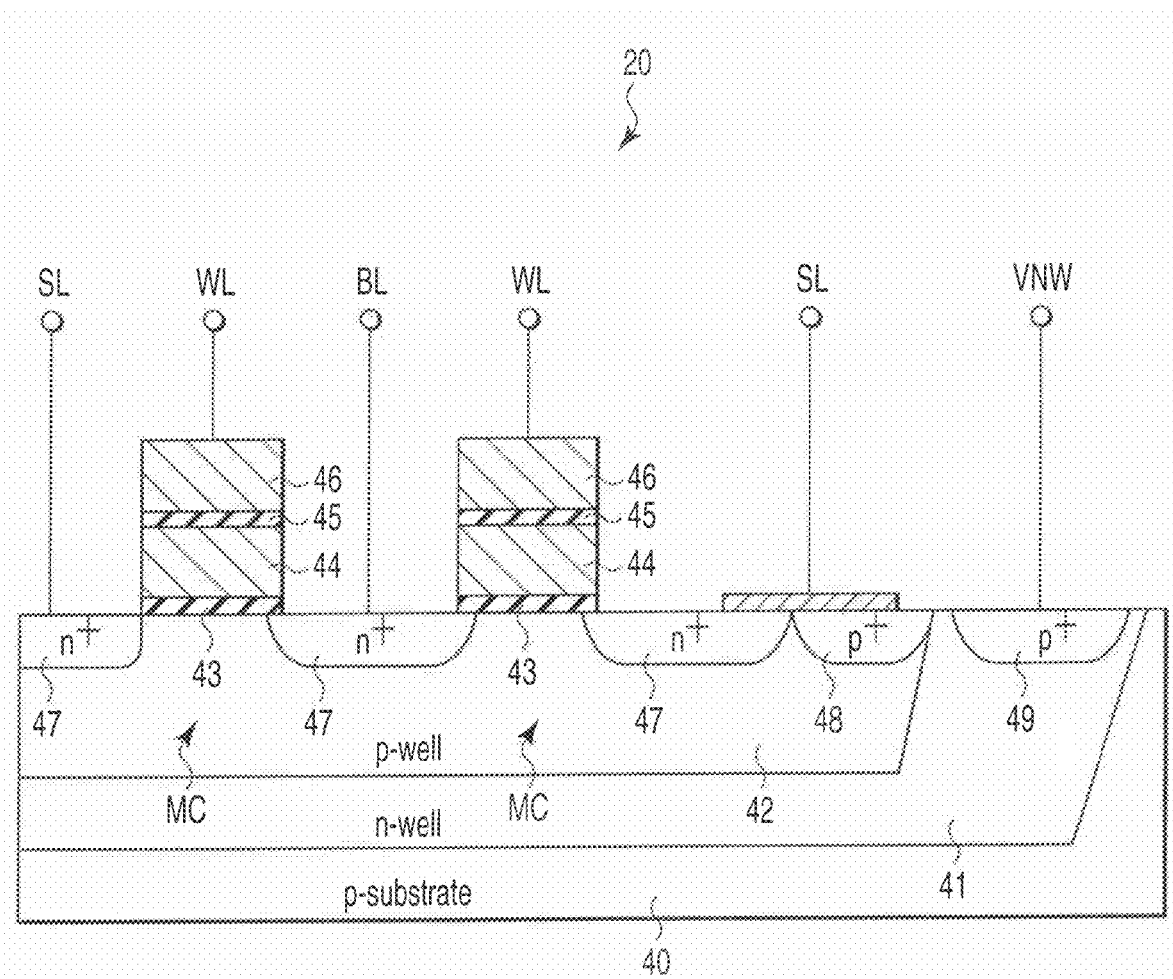
FIG. 4 is a sectional view of the memory cell array of the EEPROM according to the first embodiment of the present invention.

The sectional structure of the memory cell MC will be explained below with reference to FIG. 4. FIG. 4 is a sectional view of a partial region of the memory cell array 20. As shown in FIG. 4, an n-type well region 41 is formed in the surface region of a p-type semiconductor substrate 40, and a p-type well region 42 is formed in the surface region of the n-type well region 41. Gate insulating films 43 are formed on the p-type well region 42, and the gate electrodes of the memory cells MC are formed on the gate insulating films 43. The gate electrode of the memory cell MC has a polysilicon layer 44 formed on the gate insulating film 43, and a polysilicon layer 46 formed on an inter-gate insulating film 45 on the polysilicon layer 44. The inter-gate insulating film 45 is, e.g., a silicon oxide film or an ON film, NO film, or ONO film having a stacked structure of a silicon oxide film and silicon nitride film. The polysilicon layers 44 function as floating gates (FG), and are separated between the memory cells MC. On the other hand, the polysilicon layers 46 adjacent to each other in a direction perpendicular to the bit lines are connected together to function as a control gate (word line WL). $N^+$-type impurity diffusion layers 47 are formed in the surface of the p-well region 42 between adjacent gate electrodes. Each impurity diffusion layer 47 is shared by adjacent transistors, and functions as a source region or drain region. The source region and drain region of the memory cell MC are respectively connected to the source line SL and bit line BL. In addition, a $p^+$-type impurity diffusion layer 48 is formed in the surface region of the p-type well region 42, and an $n^+$-type impurity diffusion layer 49 is formed in the surface region of the n-type well region 41. The same potential as the source line SL is applied to the p-type well region 42 through the impurity diffusion layer 48, and a well voltage VNW is applied to the n-type well region 41 through the impurity diffusion layer 49.

A method of writing data in the EEPROM 2 in the memory system 1 having the above configuration will be explained below. When writing data in the EEPROM 2, the memory system 1 according to this embodiment uses the RAM 3 as a data buffer. That is, data is first temporarily written in the RAM 3, and then written in the EEPROM 2 from the RAM 3. This write operation will be described below by first explaining the operations between the EEPROM 2, RAM 3, and CPU 4 with reference to FIG. 5, and then explaining the internal operation of the EEPROM 2 with reference to FIG. 6.

Figure 5:
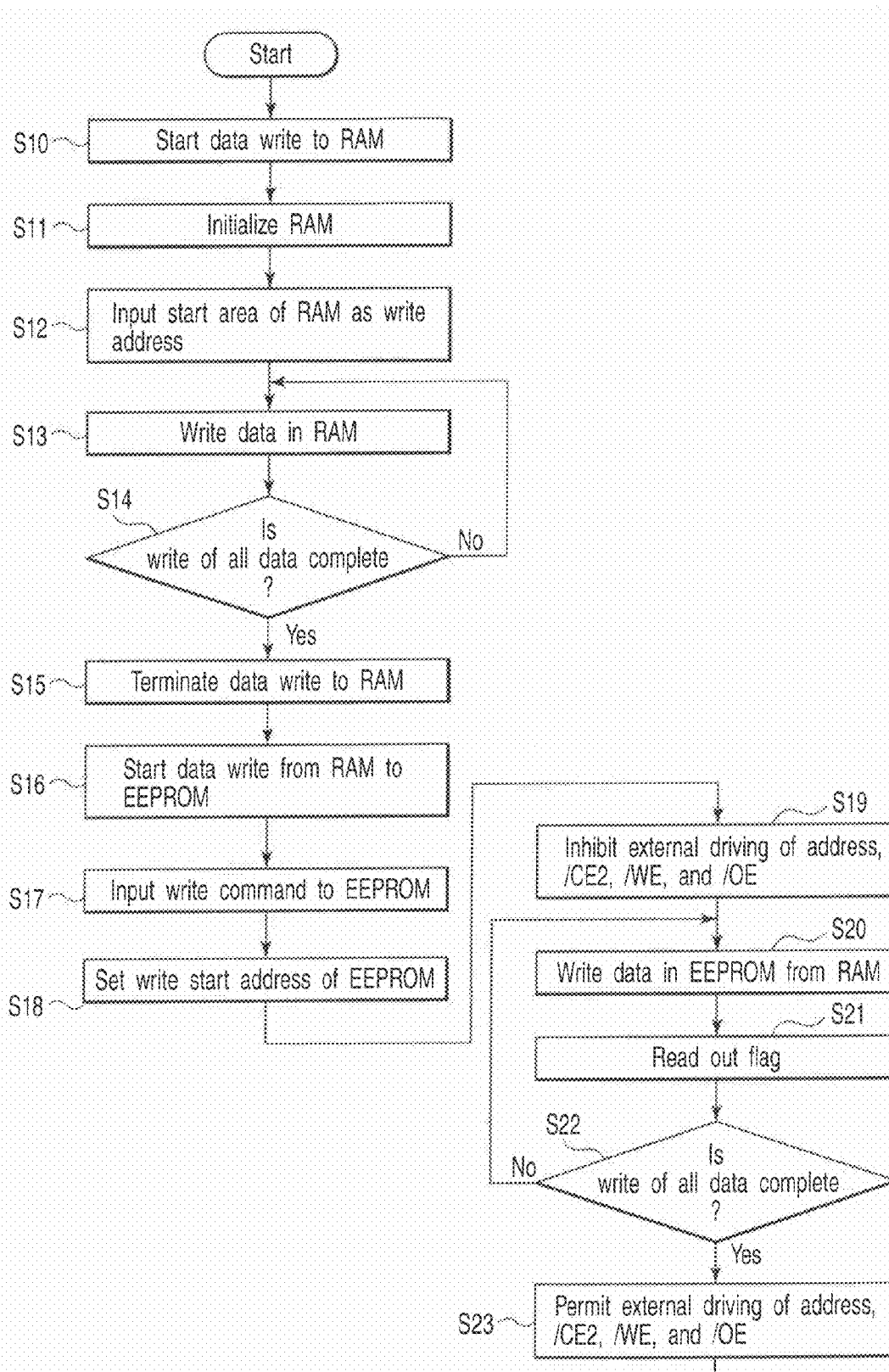
FIG. 5 is a flowchart showing a method of writing data in the EEPROM in the memory system according to the first embodiment of the present invention.

FIG. 5 is a flowchart showing the sequence of operations between the EEPROM 2, RAM 3, and CPU 4. As shown in FIG. 5, data write to the RAM 3 is first started (step S10). To write data in the RAM 3, the CPU 4 outputs the chip enable signal /CE2 to the RAM 3 to make the RAM 3 operable, thereby initializing the RAM 3 (step S11). Then, the CPU 4 outputs, to the RAM 3, the start address in the address space of the RAM 3 as a data write address (step S12). In this state, the EEPROM 2 is inoperable because the chip enable signal /CE1 is negated (to "H" level), so the address signal is input to the RAM 3 through the address bus 12. The data is input to the RAM 3 through the data bus 11, and written in the RAM 3

(step S13). Write to the RAM 3 is normally very fast because data write at one address is complete in one write cycle. When all data is completely written in the RAM 3 (YES in step S14), the write operation to the RAM 3 is complete (step S15).

Subsequently, the operation of writing the data in the EEPROM 2 from the RAM 3 starts (step S16). First, the EEPROM 2 receives a data write command (step S17). The RAM 3 or CPU 4 supplies this write command. Also, the chip enable signal /CE1 is asserted (to "L" level) to make the EEPROM 2 operable. Then, a write start address is set in the EEPROM 2 (step S18). After that, external driving of the chip enable signal /CE2 and the address signal, write enable signal /WE, and output enable signal /OE in the EEPROM 2 is inhibited (step S19). That is, the EEPROM 2 does not accept any of these signals from the CPU 4 after that.

The data held in the RAM 3 is then written in the EEPROM 2 (step S20). Whether all data is completely written can be determined by an execution flag output from the EEPROM 2. Therefore, the CPU 4 reads out the execution flag from the EEPROM 2 (step S21). If all data is completely written (YES in step S22), the write operation to the EEPROM 2 is complete. In this case, external driving of the chip enable signal /CE2, and the address signal, write enable signal /WE, and output enable signal /OE in the EEPROM 2 is permitted (step S23).

Figure 6:
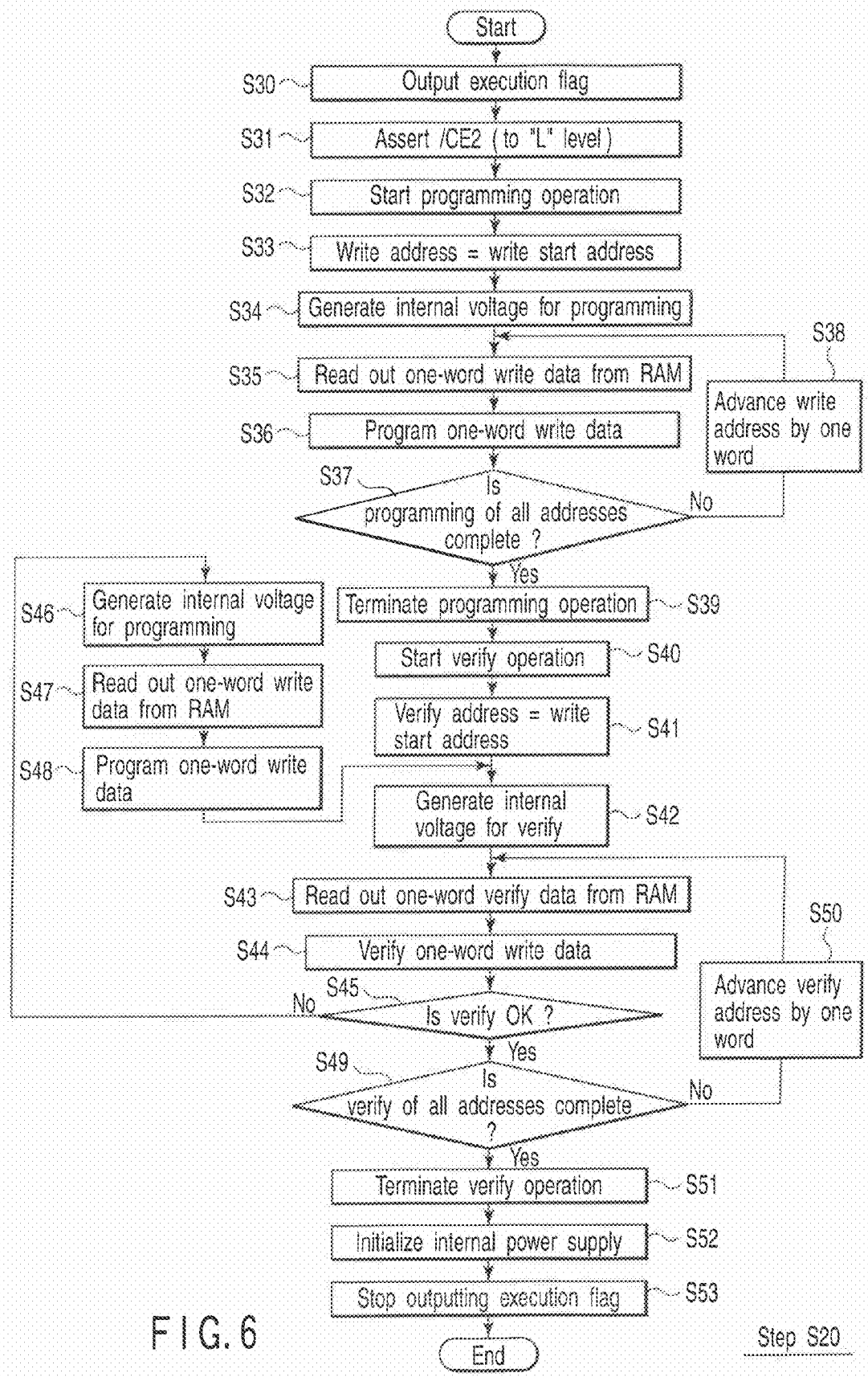
FIG. 6 is a flowchart showing the data write method of the EEPROM according to the first embodiment of the present invention.

The internal operation of the EEPROM 2 will be explained next with reference to FIG. 6. FIG. 6 is a flowchart showing the internal procedure of the EEPROM 2, and corresponds to the processing in step S20 of FIG. 5. The operation of writing data in the EEPROM 2 roughly includes two steps: a step of writing data in the memory cell MC, and a step of checking whether the data is normally written in the memory cell MC. The former step will be called a programming operation hereinafter, and the latter step will be called a verify operation hereinafter.

First, the EEPROM 2 outputs the execution flag to the CPU 4 (step S30). As described above, the execution flag indicates that data is currently being written in the EEPROM 2. Then, in response to the reception of a write command, the controller 36 instructs the command register 28 to output the chip enable signal /CE2. Therefore, the command register 28 outputs the chip enable signal /CE2 from the output buffer 29 (step S31). This makes the RAM 3 operable. That is, both the EEPROM 2 and RAM 3 included in the memory system 1 are operable at this point.

Subsequently, the programming operation starts (step S32). At the start of the programming operation, the controller 36 first sets the write start address of data (step S33). The controller 36 supplies this information to the address register 32. The address register 32 generates the row address RA and column address CA in accordance with the set write start address. Then, the voltage generator 34 generates an internal voltage for programming in accordance with an instruction from the controller 36 (step S34). The voltage generator 34 applies this internal voltage to, e.g., the row decoder 21 and write data buffer 25.

Figure 7:
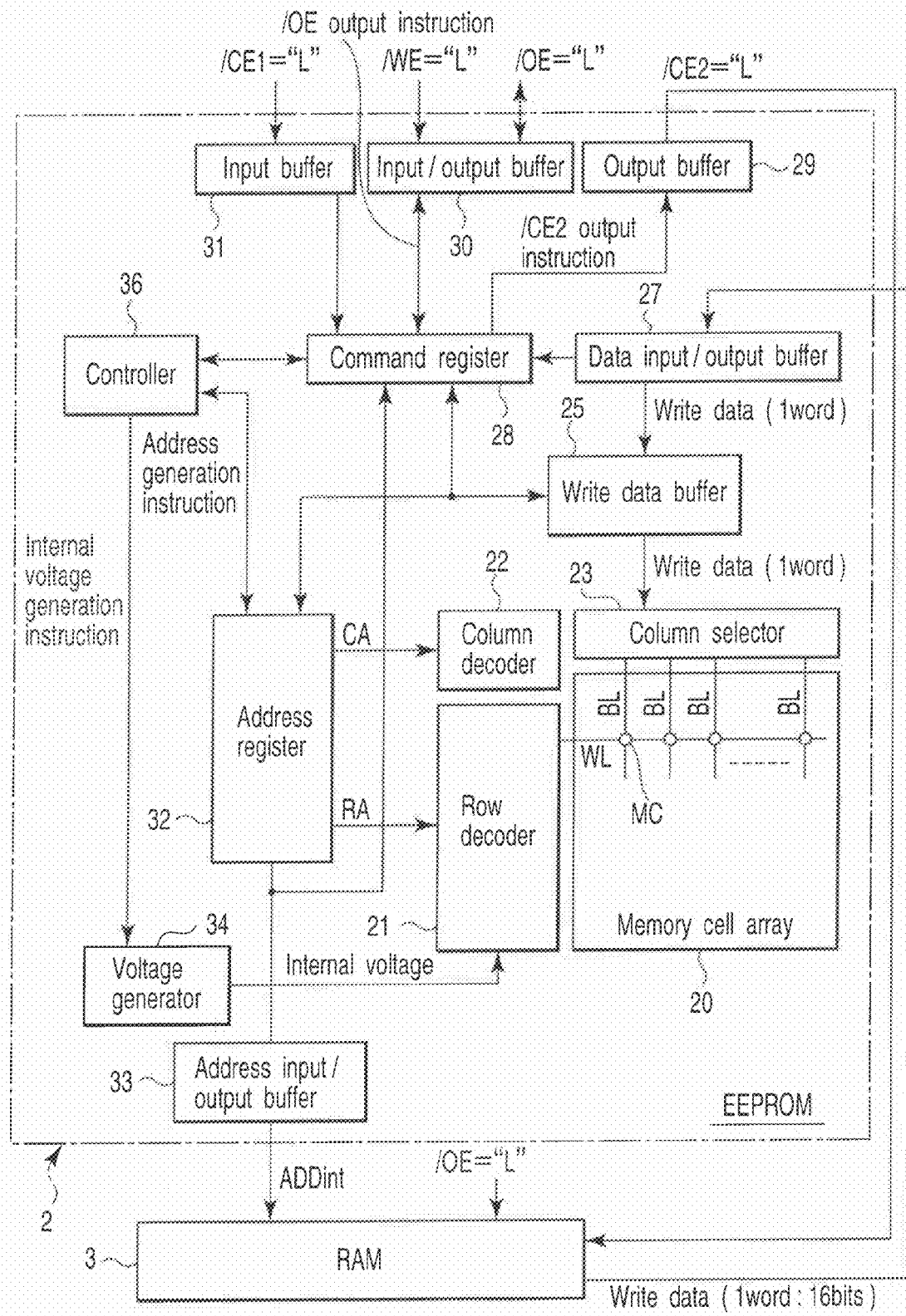
FIG. 7 is a block diagram of the EEPROM according to the first embodiment of the present invention, and shows the way data is written.

Also, the EEPROM 2 reads out one-word data from the RAM 3 (step S35). The readout one-word data is programmed in the memory cells MC (step S36). The processes in steps S35 and S36 will be explained in detail below with reference to FIG. 7. FIG. 7 is a block diagram of the EEPROM 2. As shown in FIG. 7, in step S35, the address register 32 generates an internal address ADDint in response to an address generation instruction from the controller 36. The internal address ADDint is an address signal, in the RAM 3, of data to be read out from the RAM 3. Since data is read out word by word from the RAM 3, the address register 32 updates the internal address ADDint whenever one-word data is read out from the RAM 3. When data is initially read out from the RAM 3, the internal address ADDint corresponds to the start address in the address space of the RAM 3. For example, the CPU 4 supplies this information to the EEPROM 2 beforehand, so the EEPROM 2 grasps the information. The address generated by the address register 32 is supplied from the address input/output buffer 33 to the RAM 3. In addition, in accordance with an output enable signal output instruction from the controller 36 and command register 28, the input/output buffer 30 outputs the output enable signal /OE to the RAN 3. This process may also be performed in step S31 in advance. Since the chip enable signal /CE2 and output enable signal /OE are asserted and the address signal is input, the RAM 3 outputs, to the EEPROM 2, one-word data held in an area corresponding to the address signal.

In the EEPROM 2, the data input/output buffer 27 receives the one-word data output from the RAM 3, and transfers the data to the write data buffer 25. The write data buffer 25 programs the transferred data in memory cells of one word connected to bit lines selected by the column decoder 22 and word lines selected by the row decoder 21 (step S36).

If programming of all addresses is not complete (NO in step S37), the address register 32 advances the internal address ADDint by one word in accordance with an instruction from the controller 36 (step S38). That is, the address register 32 generates the internal address ADDint corresponding to one-word data next to the one-word data already written in the memory cells MC. More specifically, the address register 32 updates the internal address ADDint so that the address corresponds to the next data. Steps S35 and S36 are repeated by using the updated internal address ADDint.

If programming of all addresses is complete (YES in step S37), the programming operation itself is complete (step S39). Then, the verify operation starts (step S40).

At the start of the verify operation, the controller 36 first sets a verify address holding data to be verified (step S41). The write start address is set as an initially set verify address. The controller 36 supplies this information to the address register 32. In accordance with the set verify address, the address register 32 generates the row address RA and column address CA. Then, the voltage generator 34 generates an internal voltage for verify in accordance with an instruction from the controller 36 (step S42). The voltage generator 34 applies this internal voltage to, e.g., the row decoder 21 and write data buffer 25.

Also, the EEPROM 2 reads out one-word verify data from the RAM 3 (step S43). The EEPROM 2 verifies the already written one-word data by using the readout one-word verify data (step S44). Steps S43 and S44 will be explained in detail below. In step S43, the address register 32 generates the internal address ADDint in response to an address generation instruction from the controller 36. When initially reading out data from the RAM 3, the internal address ADDint corresponds to the start address in the address space of the RAM 3. The address input/output buffer 33 supplies the address generated by the address register 32 to the RAM 3. Accordingly, the RAM 3 outputs, to the EEPROM 2, one-word data held in an area corresponding to the internal address ADDint. This process is the same as in step S35 of programming.

In the EEPROM 2, the data input/output buffer 27 receives the one-word data output from the RAM 3, and transfers the data to the write data buffer 25. Also, the already written one-word data is read out from memory cells of one word connected to bit lines selected by the column decoder 22 and word lines selected by the row decoder 21, and sensed and amplified by the sense amplifier. The verify circuit 35 verifies the amplified readout data by using the data transferred to the write data buffer 25. That is, the verify circuit 35 verifies whether the data read out from the memory cells MC matches the original correct data read out from the RAM 3.

If the verify result indicates that the data is not correctly written (NO in step S45), the voltage generator 34 generates an internal voltage for programming as in step S34 (step S46). Subsequently, as in step S35, one-word data corresponding to the address is read out from the RAM 3 (step S47), and programmed (step S48). Note that since the verify data is read out in step S43, this data may also be written in the memory cells MC. In this case, step S47 can be omitted.

If the verify result indicates in step S45 that the data is correctly written (YES in step S45), and if verify of all addresses is not complete (NO in step S49), the address register 32 advances the internal address ADDint by one word in accordance with an instruction from the controller 35 (step S50). That is, the address register 32 generates the internal address ADDint corresponding to one-word data next to the verified one-word data. Steps S43 to S48 are repeated by using the updated internal address ADDint.

If verify of all addresses is complete (YES in step S49), the verify operation itself is complete (step S51). The controller 36 initializes the internal power supply 34 to set it in a standby state, and stops outputting the execution flag.

Thus, the write operation of the EEPROM 2 is complete.

As described above, the memory system of the present invention achieves effect (1) below.

(1) The Speed of Data Write can be Increased (No. 1).

When writing data in the EEPROM 2, the memory system according to this embodiment uses the RAM 3 as a buffer memory. That is, this memory system first temporarily writes write data in the RAM 3. After that, the EEPROM 2 reads out the data from the RAM 3, and writes the data in memory cells. Accordingly, the speed of data write to the EEPROM 2 can be increased without increasing the size of the write data buffer of the EEPROM 2.

Figure 8:
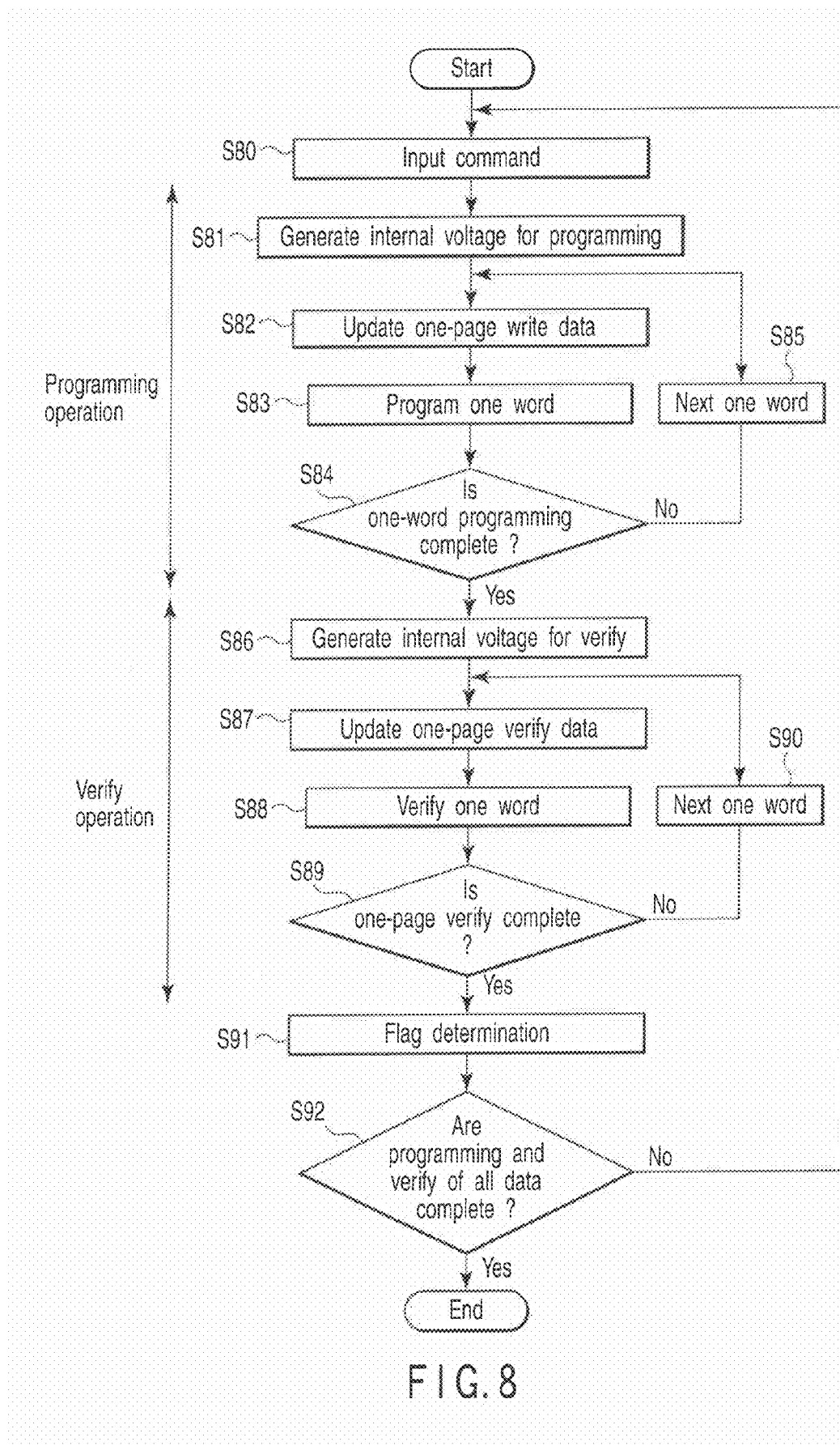
FIG. 8 is a flowchart showing a method of writing data in the EEPROM.

This effect will be explained below in comparison with the case that the RAM 3 is not used as a buffer memory. FIG. 8 is a flowchart of a write operation to the EEPROM 2 when the RAM 3 is not used as a buffer memory.

As shown in FIG. 8, when the EEPROM 2 receives a write command (step S80), the voltage generator generates an internal voltage for programming (step S81). Then, write data in the write data buffer is updated (step S82). The write data buffer is capable of holding, e.g., data of one page, and can automatically write one-page data in memory cells by one write command. In step S82, therefore, one-word data to be written is selected from the one-page data. This one-word data selected in step S82 is then programmed (step S83). If programming of the one-page data is not complete (NO in step S84), the address is updated to correspond to the next one-word data in the write data buffer (step S85), and the processes in steps S82 and S83 are performed.

If programming of the one-page data is complete (YES in step S84), a verify operation is performed. That is, the voltage generator generates an internal voltage for verify (step S86). Then, verify data in the write data buffer is updated (step S87). That is, one-word data to be verified is selected from the one-page data. This one-word data is read out from the memory cells MC, and verified (step S88). If verify of the one-page data is not complete (NO in step S89), the address is updated to correspond to the next one-word data in the write data buffer (step S90), and the processes in steps S87 and S88 are performed.

If verify of the one-page data is complete (YES in step S89), flag determination is performed. If programming and verify of all pages are complete (YES in step S92), the write operation is complete because the outputting of the execution flag is stopped. If not (NO in step S92), the process returns to step S80 to repeat the series of processes.

Figure 9:
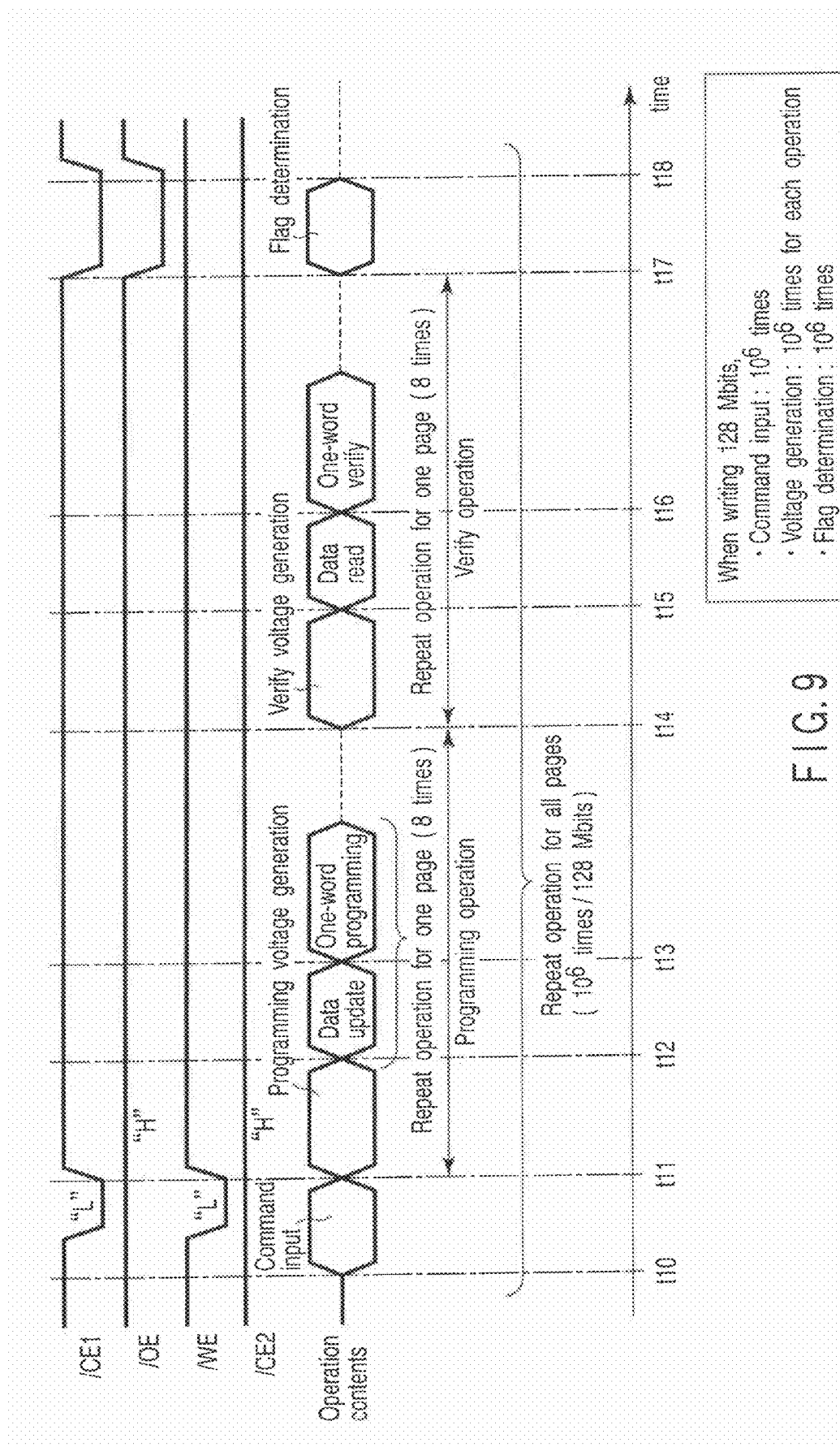
FIG. 9 is a timing chart showing the operation contents of the write method shown in FIG. 8.

FIG. 9 is a timing chart showing the above processing. That is, FIG. 9 is a timing chart showing the chip enable signals /CE1 and /CE2, the write enable signal /WE, the output enable signal /OE, and the operation contents in the memory system during the write operation. Note that an explanation will be made by taking as an example the case that the size of one page (the size of the write data buffer) is 128 bits, the size of data to be written in memory cells at once is one word (16 bits), and the size of whole data to be written is 128 Mbits.

As shown in FIG. 9, the chip enable signal /CE2 is normally negated (to "H" level). When a write command is input at time t10, an internal voltage for programming is generated at time t11, data is updated at time t12 (step S82), and one word is programmed at time t13 (step S83). The data update and one-word programming are repeated (one page size: 128 bits/one word size: 16 bits)=8 times.

When 8-time programming is complete, an internal voltage for verify is generated at time t14, data is updated at time t15 (step S87), and one word is verified at time t16 (step S88). The data update and one-word verify are similarly repeated eight times.

When 8-time verify is complete, flag determination is performed at time t17. The processing from time t10 to time t18 described above is repeated for all pages. That is, since (16 bits×8 times)=128 bits are written by one command input, the above processing is repeated $10^6$ times if the size of the whole data is 128 Mbits. To write the whole data, therefore, it is necessary to input the write command $10^6$ times, generate the voltage $10^6$ times for each of programming and verify, and perform flag determination $10^6$ times. The time necessary to generate the voltage is particularly relatively long, i.e., 3 to 4 μs, so the above method requires a long write time.

This is so because the data size that can be written by one command input is limited to the data size that can be held in the write data buffer 25. That is, if the data size that the write data buffer 25 can hold is large, it is possible to reduce the numbers of times of write command input, voltage generation, and flag determination accordingly. However, if the data size that the write data buffer 25 can hold increases, the size of the write data buffer 25 also increases, and this increases the ratio occupied by the buffer 25 in the chip. This increases the chip size, and hence raises the cost.

Figure 10:
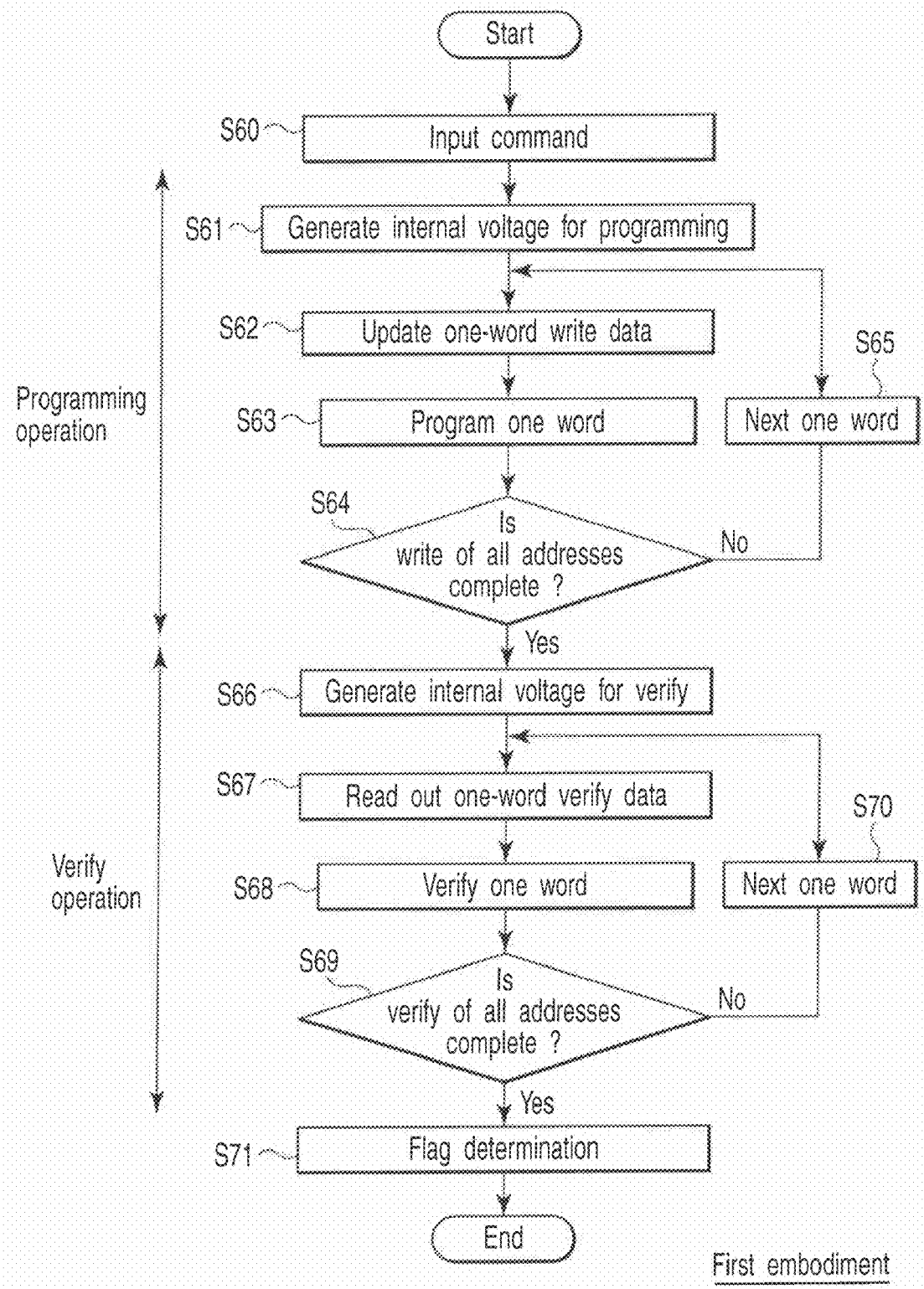
FIG. 10 is a flowchart showing a data write method of the EEPROM according to the first embodiment of the present invention.

A method according to this embodiment will be explained below in comparison with the above method. FIG. 10 is a flowchart of a write operation to the EEPROM 2 according to this embodiment. FIG. 10 is a simplified version of FIG. 6.

As shown in FIG. 10, when the EEPROM 2 receives a write command (step S60), the voltage generator 34 generates an internal voltage for programming (step S61). Then, one-word write data is read out from the RAM 3 to the write data buffer 25 (step S62). This one-word data read out in step S62 is programmed (step S63). If programming of all addresses, i.e., all data is not complete (NO in step S64), the address is updated to correspond to the next one-word data in the RAM 3 (step S65), and the processes in steps S62 and S63 are performed.

If programming of all data is complete (YES in step S64), a verify operation is performed. That is, the voltage generator 34 generates an internal voltage for verify (step S66). Then, one-word verify data is read out from the RAM 3 to the write data buffer (step S67). One-word data is read out from the memory cells MC and verified (step S68). If verify of all data is not complete (NO in step S69), the address is updated to correspond to the next one-word data in the RAM 3 (step S70), and the processes in steps S67 and S68 are performed. If verify of all data is complete (YES in steps S69), flag determination is performed, and the write operation is complete.

Figure 11:
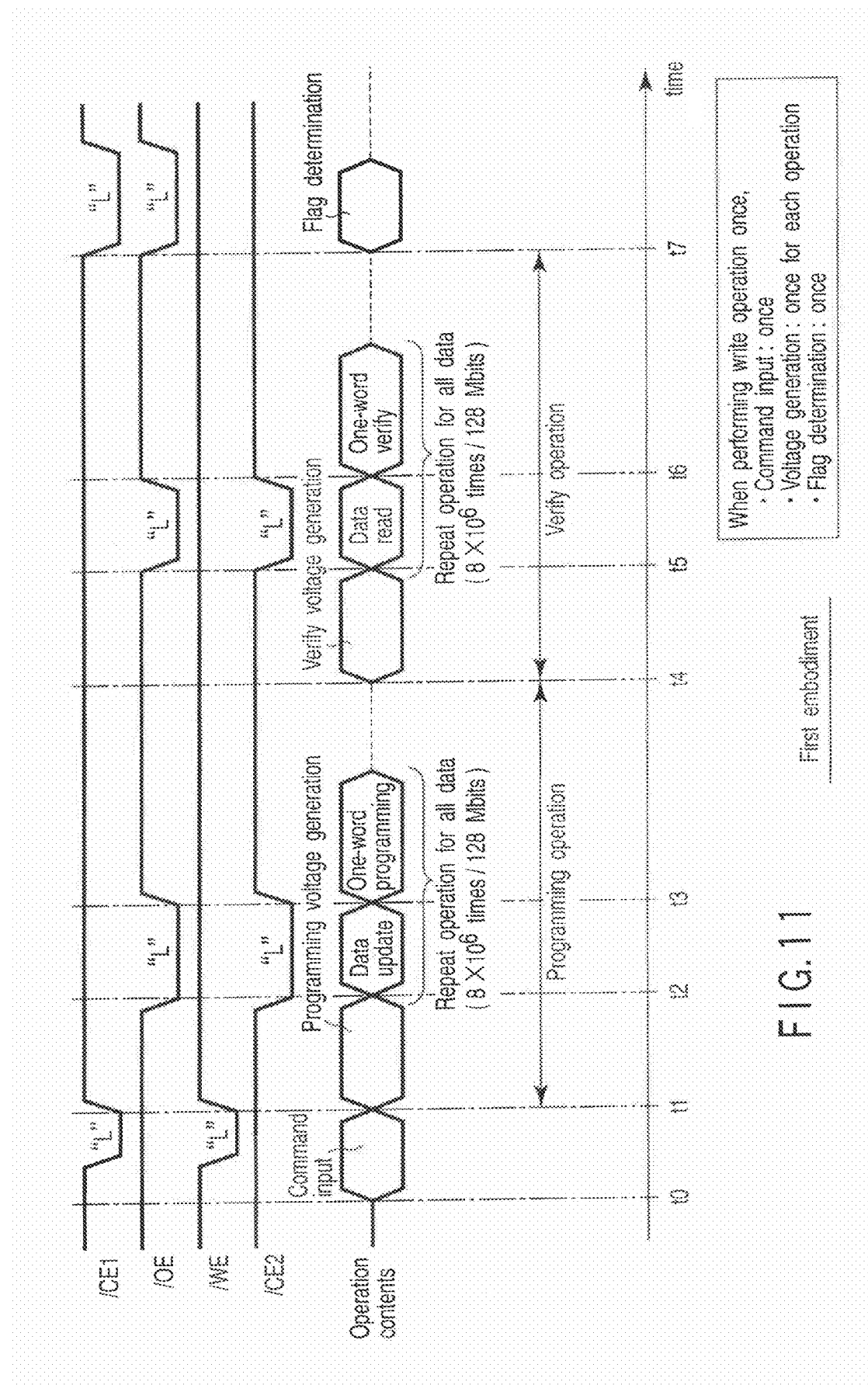
FIG. 11 is a timing chart showing the operation contents of the write method shown in FIG. 10.

FIG. 11 is a timing chart showing the above processing. That is, FIG. 11 is a timing chart showing the chip enable signals /CE1 and /CE2, the write enable signal /WE, the output enable signal /OE, and the operation contents in the memory system 1 during the write operation according to this embodiment. Note that similar to FIG. 9, an explanation will be made by taking as an example the case that the size of one page is 128 bits, the size of data to be written in memory cells at once is one word (16 bits), and the size of whole data to be written is 128 Mbits.

Examples of the timings at which the individual control signals are enabled are as follows. The chip enable signals /CE1 and /CE2 are enabled (to "L" level) when accessing the respective chips. That is, the chip enable signal /CE1 changes to "L" level when a command is input and flag determination is performed. The chip enable signal /CE2 changes to "L" level when data is read out from the RAM 3. The output enable signal /OE changes to "L" level when data or a flag is read out. The write enable signal WE changes to "L" level only when a command is input.

As shown in FIG. 11, when a write command is input at time to, the chip enable signals /CE1 and /CE2 are asserted, and the EEPROM 2 and RAM 3 are made operable. An internal voltage for programming is generated at time t1, data is read out from the RAM 3 at time t2 (step S62), and one word is programmed at time t3 (step S63). When reading out data, the output enable signal /OE and chip enable signal /CE2 are asserted. These data read and one-word programming are repeated (the size of whole data: 128 Mbits/the size of one word: 16 bits)=$8 \times 10^6$ times.

When ($8 \times 10^6$)-time programming is complete, an internal voltage for verify is generated at time t4, data is read out from the RAM 3 at time t5, and one word is verified at time t6 (step S68). When reading out data, the output enable signal /OE and chip enable signal /CE2 are similarly asserted. These data read/update and one-word verify are similarly repeated ($8 \times 10^6$) times.

When ($8 \times 10^6$)-time verify is complete, the chip enable signal /CE1 and output enable signal /OE are asserted at time t7, flag determination is performed, and the write operation is complete. The method according to this embodiment programs and verifies the whole data (128 Mbits) by one command input. To write the whole data, therefore, it is only necessary to input a command once, generate a voltage once for each of programming and verify, and perform flag determination once.

As described above, the memory system according to this embodiment can largely reduce the numbers of times of write command input, voltage generation, and flag determination required for data write. Accordingly, the write speed can be increased. To write the whole data by performing write command input, voltage generation, and flag determination once, this embodiment uses the RAM 3 as a buffer memory of the EEPROM 2. This makes it possible to continuously write the whole data, and reduce the numbers of times of write command input, voltage generation, and flag determination to 1. Also, the EEPROM 2 generates the chip enable signal /CE2 and output enable signal /OE. Therefore, the EEPROM 2 and RAM 3 can operate at the same time, so the RAM 3 can be used as a buffer memory.

Furthermore, since the RAM 3 is used as a buffer memory, it is unnecessary to increase the data size that the write data buffer 25 can hold. That is, the above effects can be obtained without changing the size of the write data buffer 25.

Note that in the flowchart shown in FIG. 6, the process in step S46 is performed if verify is NG in step S45. However, the process may also return to, e.g., step S34. In this case, it is also possible to store memory cells for which verify is OK in registers, and omit steps S36 and S44 for these cells by making the row decoder 21 inoperable.

Second Embodiment

Figure 12:
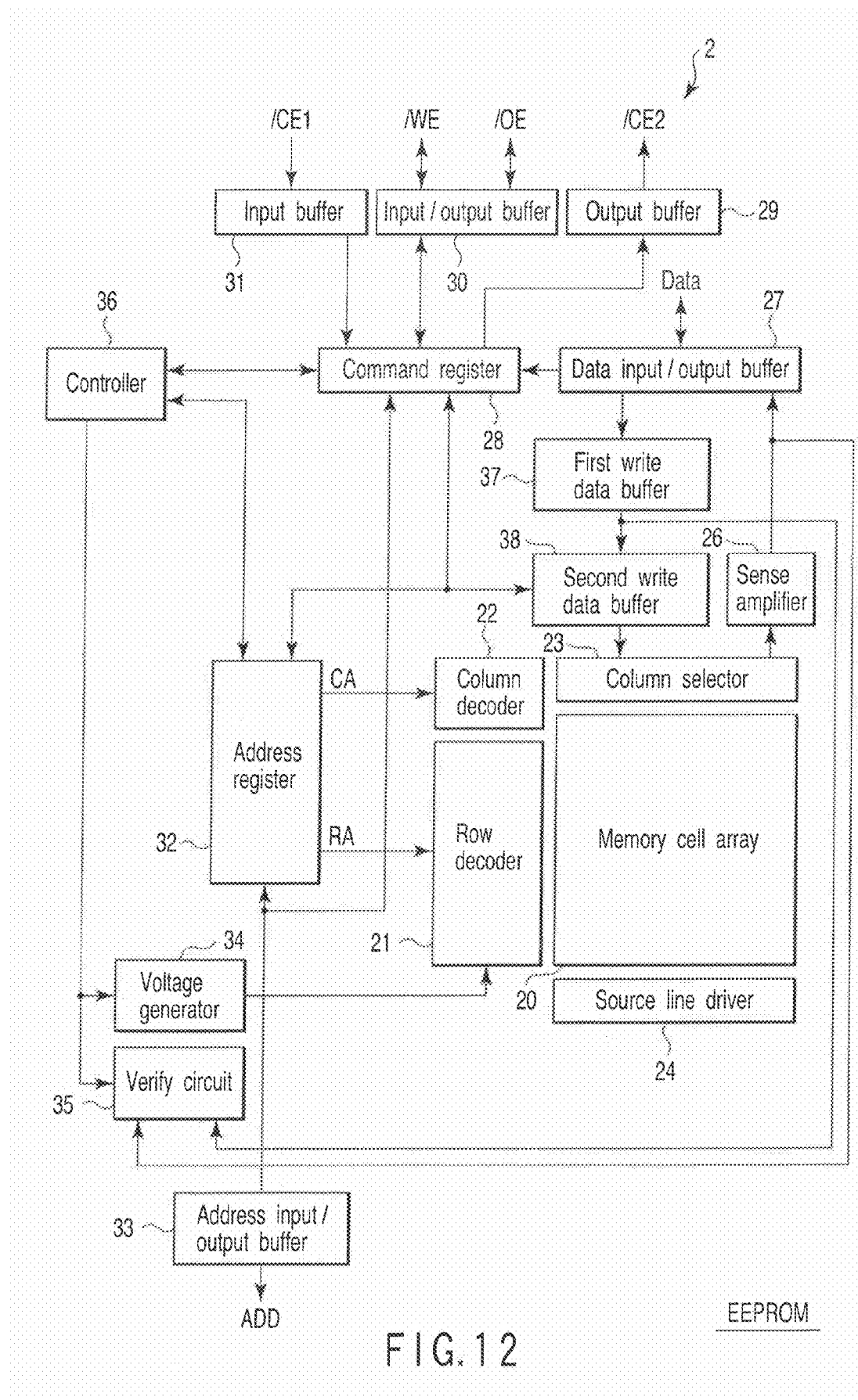
FIG. 12 is a block diagram showing an EEPROM according to the second embodiment of the present invention.

A semiconductor memory device, semiconductor device, and data write method according to the second embodiment of the present invention will be explained below. This embodiment uses two buffer stages instead of the write data buffer 25 of the first embodiment described above. The configuration of a memory system 1 is the same as that shown in FIG. 1 explained in the first embodiment, so a repetitive explanation will be omitted. FIG. 12 is a block diagram of an EEPROM 2 according to this embodiment.

As shown in FIG. 12, the EEPROM 2 has an arrangement in which the write data buffer 25 is replaced with a first write data buffer 37 and second write data buffer 38 in the arrangement explained with reference to FIG. 2 in the first embodiment. The rest of the arrangement is the same as FIG. 2. The first write data buffer 37 receives data from a data input/output buffer 27, and holds the data. The second write data buffer 38 receives data from the first write data buffer 37, and writes the received data word by word in a memory cell array 20.

Figure 13:
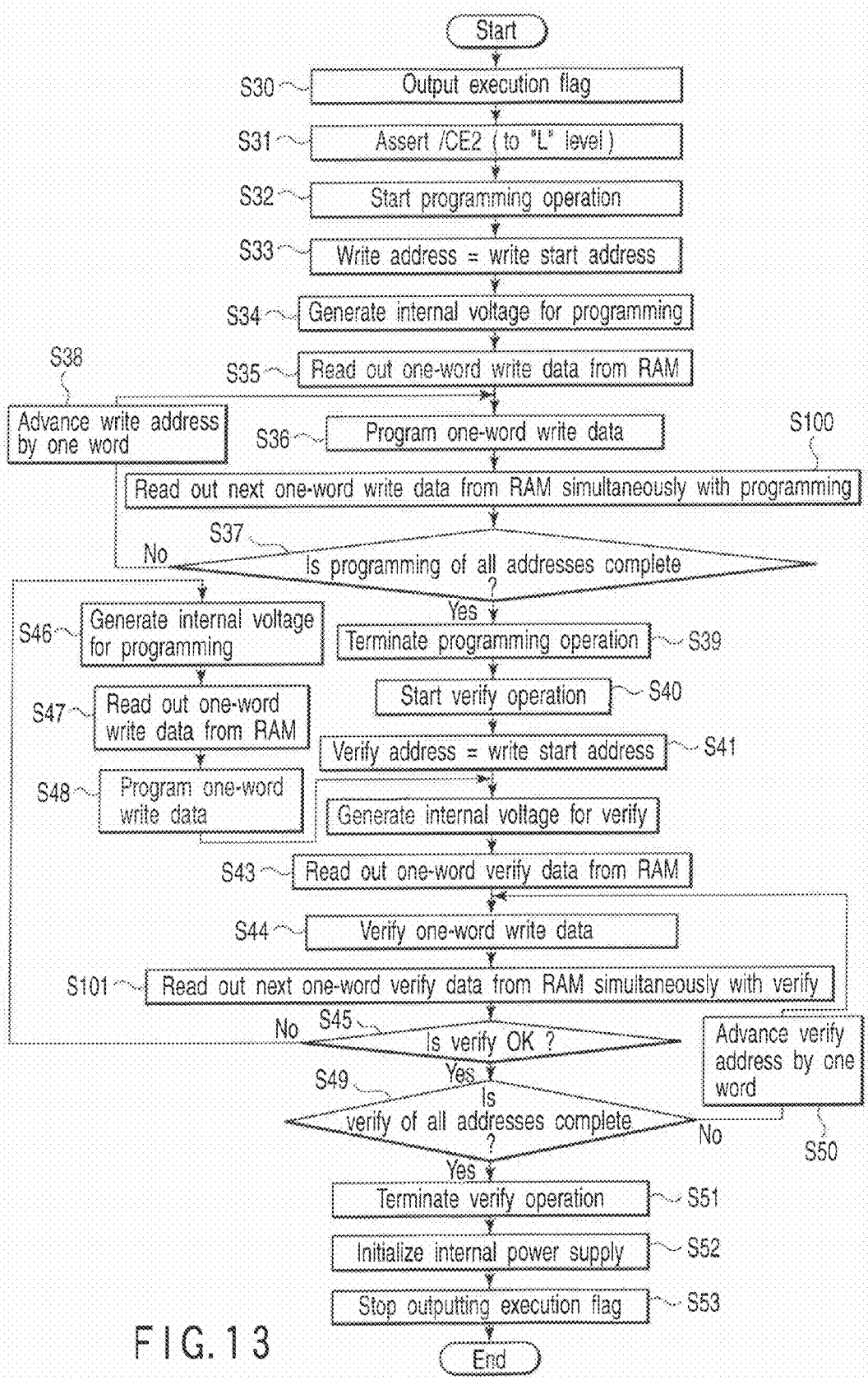
FIG. 13 is a flowchart showing a data write method of the EEPROM according to the second embodiment of the present invention.

A method of writing data in the EEPROM 2 in the memory system 1 having the above configuration will be explained below. Since the operations between the EEPROM 2, a RAM 3, and a CPU 4 are the same as in FIG. 5 explained in the first embodiment, the internal operation of the EEPROM 2 will be explained with reference to FIG. 13. FIG. 13 is a flowchart showing the procedure of the EEPROM 2.

As shown in FIG. 13, the process is the same as the first embodiment until step S36, except that one-word write data read out from the RAM 3 in step S35 is transferred to the first write data buffer 37, and immediately transferred to the second write data buffer 38. In step S36, the one-word write data is programmed. In this case, the EEPROM 2 reads out the next one-word write data from the RAM 3 simultaneously with programming (step S100). FIG. 14 shows this data read. FIG. 14 is a block diagram showing the arrangement of a portion of the EEPROM 2. Note that the data programmed in memory cells MC in steps S36 and S37 will be called first data hereinafter, and the next one-word write data read out from the RAM 3 will be called second data hereinafter.

As shown in FIG. 14, the first write data buffer 37 is empty while the data held in the second write data buffer 38 is programmed in the memory cells MC. In the period during which the first data is programmed, therefore, an address input/output buffer 33 generates an internal address ADDint corresponding to the next one word, and the second data is read out to the first write data buffer 37. That is, programming of the first data and read of the second data from the RAM are performed in parallel.

If programming of all addresses is not complete (NO in step S37), the write address is advanced by one word (step S38), and the process returns to step S36.

A verify operation is similar to the write operation. As shown in FIG. 13, the process is the same as the first embodiment until step S44, except that one-word verify data read out from the RAM 3 in step S43 is transferred to the first write data buffer 37, and immediately transferred to the second write data buffer 38. In step S44, the one-word data is verified. In this case, the EEPROM 2 reads out the next one-word verify data from the RAM 3 simultaneously with verify (step S101). That is, verify using the first data (verify data) and read of the second data (verify data) from the RAM are performed in parallel. If verify of all addresses is not complete (NO in step S49), the verify address is advanced by one word (step S50), and the process returns to step S44. The rest of the operation is the same as the first embodiment.

As described above, the memory system according to this embodiment achieves effect (2) below in addition to effect (1) explained in the first embodiment.

(2) The Speed of Data Write can be Increased (No. 2).

Figure 15:
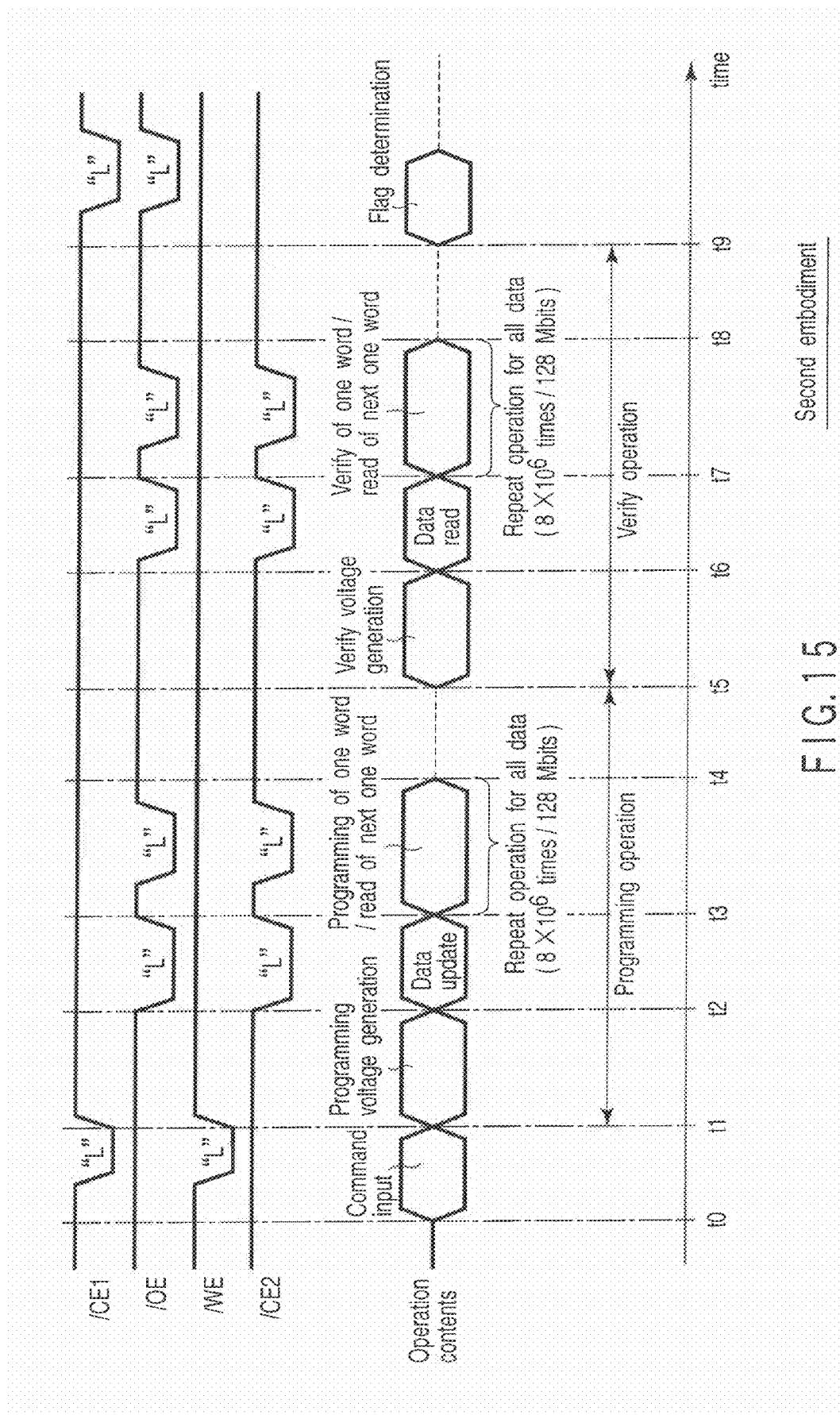
FIG. 15 is a timing chart showing the operation contents when data is written in the EEPROM according to the second embodiment of the present invention.

The EEPROM according to this embodiment has the two write data buffers 37 and 38 connected in series. Accordingly, it is possible to largely reduce the time required for data read during programming and verify, and greatly increase the data write speed. This effect will be explained with reference to FIG. 15. FIG. 15 is a timing chart showing chip enable signals /CE1 and /CE2, a write enable signal /WE, an output enable signal /OE, and the operation contents in the memory system 1 during the write operation according to this embodiment. Note that as in FIG. 11 explained in the first embodiment, an explanation will be made by taking as an example the case that the size of one page is 128 bits, the size of data to be written in memory cells at once is one word (16 bits), and the size of whole data to be written is 128 Mbits.

As shown in FIG. 15, the programming operation is performed following the same procedure as in the first embodiment until time t3. At time t3, one-word data read out from the RAM 3 at time t2 is programmed in the memory cells MC. At the same time, the next one-word data is read out from the RAM 3 to the EEPROM 2. The time required for one-word programming is normally about 1 μs, and this period is sufficiently long to read out one-word data. Accordingly, the next write data is already read out at time t4 at which programming started at time t3 is complete, so the write data read out from time t3 to time t4 is programmed at time t4. The above processing is repeated for all data ($8\times10^6$ times/128 Mbits).

A verify operation is similar to the programming operation. At time t7, verify is performed using one-word data read out from the RAM 3 at time t6. At the same time, the next one-word data is read out from the RAM 3 to the EEPROM 2. The time required for one-word verify is normally about 0.5 μs, and this period is also sufficiently long to read out one-word data. Accordingly, the next verify data is already read out at time t8 at which verify started at time t7 is complete, so verify is performed at time t8 by using data read out from time t7 to time t8. The above processing is repeated for all data ($8\times10^6$ times/128 Mbits).

As described above, of data to be read out from the RAM 3, data except for the first one-word data to be written in memory cells and the first one-word data to be verified are read out from the RAM 3 during programming or verify. When viewed from outside the EEPROM 2, therefore, the time required to read out these data is zero. In other words, when compared to the method explained in the first embodiment, the time of data read from the RAM 3 during programming and the time of data read from the RAM 3 during verify can be reduced to $1/(8\times10^6)$. As a consequence, the data write speed can be increased. Accordingly, data can be written in the EEPROM 2 at the same speed as when the size of the write data buffer is the same as the RAM 3.

Third Embodiment

Figure 16:
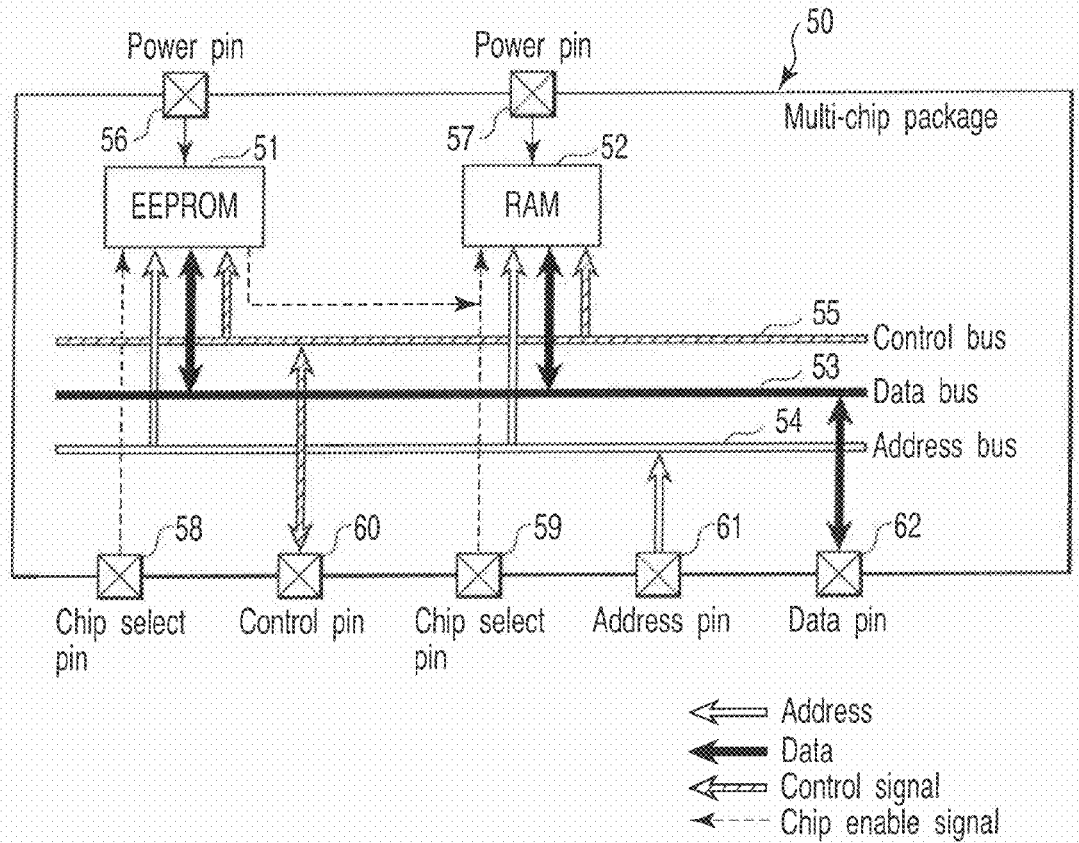
FIG. 16 is a block diagram of a multi-chip package according to the third embodiment of the present invention.

A semiconductor memory device, semiconductor device, and data write method according to the third embodiment of the present invention will be explained below. This embodiment is directed to a multi-chip package obtained by packaging an EEPROM 2 and RAM 3 into a single package in the first and second embodiments. The rest of the arrangement is the same as the first and second embodiments, so a repetitive explanation will be omitted. FIG. 16 is a block diagram of a semiconductor device 50 of a memory system 1 according to this embodiment.

As shown in FIG. 16, the semiconductor device 50 comprises a semiconductor chip 51 having an EEPROM, a semiconductor chip 52 having a RAM, a data bus 53, an address bus 54, a control bus 55, power pins 56 and 57, chip select pins 58 and 59, a control pin 60, an address pin 61, and a data pin 62. These components are packaged in the same semiconductor package.

The arrangements of the semiconductor chips 51 and 52 are the same as the EEPROM 2 and RAM 3 explained in the first and second embodiments. The data bus 53, address bus 54, and control bus 55 interconnect the semiconductor chips 51 and 52. Also, the data bus 53, address bus 54, and control bus 55 transfer data, address signals, and control signals to each other.

The power pins 56 and 57 receive externally applied voltages, and respectively apply the applied voltages to the semiconductor chips 51 and 52. The chip select pins 58 and 59 respectively receive externally supplied enable signals /CE1 and /CE2 and supply them to the semiconductor chips 51 and 52. The semiconductor chips 51 and 52 share the control pin 60, address pin 61, and data pin 62. A control signal (e.g., /WE or /OE) externally supplied to the control pin 60 is supplied to the semiconductor chip 51 or 52 through the control bus 55. An address signal externally supplied to the address pin 61 is supplied to the semiconductor chip 51 or 52 through the address bus. Data supplied to the data pin 62 is supplied to the semiconductor chip 51 or 52 through the data bus 53. These signals supplied to the control pin 60, address pin 61, and data pin 62 are supplied to the semiconductor chip 51 or 52 that is made operable by the enable signal /CE1 or /CE2.

Note that as explained in the first and second embodiments, the semiconductor chip 51 can output the enable signal /CE2 and write enable signal /WE to the semiconductor chip 52.

Figure 17:
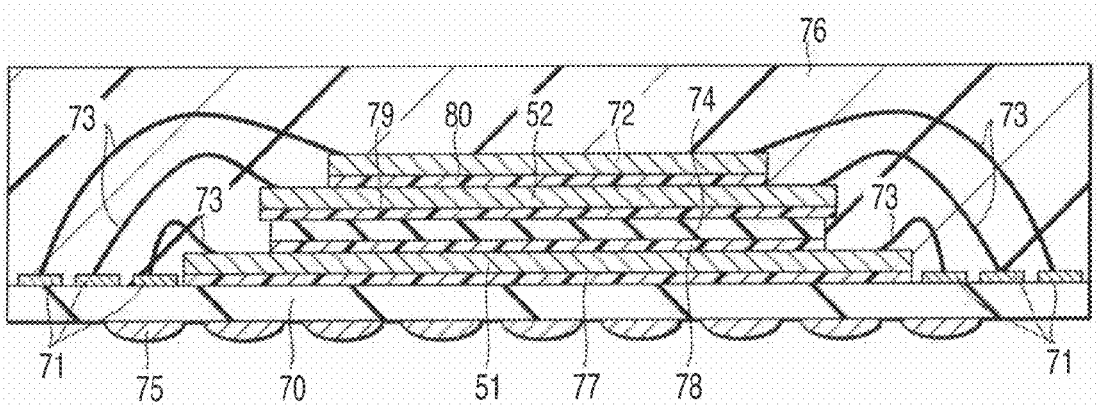
FIG. 17 is a sectional view of the multi-chip package according to the third embodiment of the present invention.

FIG. 17 is a sectional view of the semiconductor device 50. As shown in FIG. 17, the semiconductor device 50 is a BGA (Ball Grid Array) in which three semiconductor chips including the semiconductor chips 51 and 52 are three-dimensionally mounted. The semiconductor device 50 comprises a printed circuit board 70, copper interconnections 71, the semiconductor chips 51 and 52, a semiconductor chip 72, bonding wires 73, a spacer 74, solder bumps 75, and a sealing resin 76.

A die attaching member 77 adheres the semiconductor chip 51 on the surface of the printed circuit board 70 with the bonding pad surface facing up. A die attaching member 78 adheres the spacer 74 on the semiconductor chip 51. The spacer 74 is smaller than the semiconductor chip 51, and hence does not cover the bonding pads of the semiconductor chip 51. A die attaching member 79 adheres the semiconductor chip 52 on the spacer 74 with the bonding pad surface facing up. In addition, a die attaching member 90 adheres the semiconductor chip 72 on the semiconductor chip 52 with the bonding pad surface facing up. The semiconductor chip 72 is smaller than the semiconductor chip 52, and hence does not cover the bonding pads of the semiconductor chip 52.

On the upper surface of the printed circuit board 70, the copper interconnections 71 are formed for the semiconductor chips 51, 52, and 72, and the bonding wires 73 connect the bonding pads of the semiconductor chips 51, 52, and 72 to the copper interconnections 71. The sealing resin 76 is also formed on the upper surface of the printed circuit board 70 so as to cover the semiconductor chips 51, 52, and 72, copper interconnections 71, and bonding wires 73.

The solder bumps 75 are formed on the lower surface of the printed circuit board 70. The solder bumps 75 function as connectors to the outside. Multiple metal interconnection layers are formed inside the printed circuit board 70 to connect the solder bumps 75 and copper interconnections 71. Each of the solder bumps 75 corresponds to one of the pins 56 to 62 explained in FIG. 16.

As described above, an EEPROM and RAM may also be formed in the same package as long as the EEPROM can control the RAM.

In the memory systems according to the first to third embodiments of the present invention as described above, the EEPROM 2 can output the enable signals /CE2 and /OE for making the RAM 3 operable, and can also output an address signal to the RAM 3. Accordingly, data is written in the EEPROM 2 by using the RAM 3 formed outside the EEPROM 2 as a buffer memory. This makes it possible to increase the speed of write to the EEPROM 2 without increasing the size of the write data buffer of the EEPROM 2.

Figure 18:
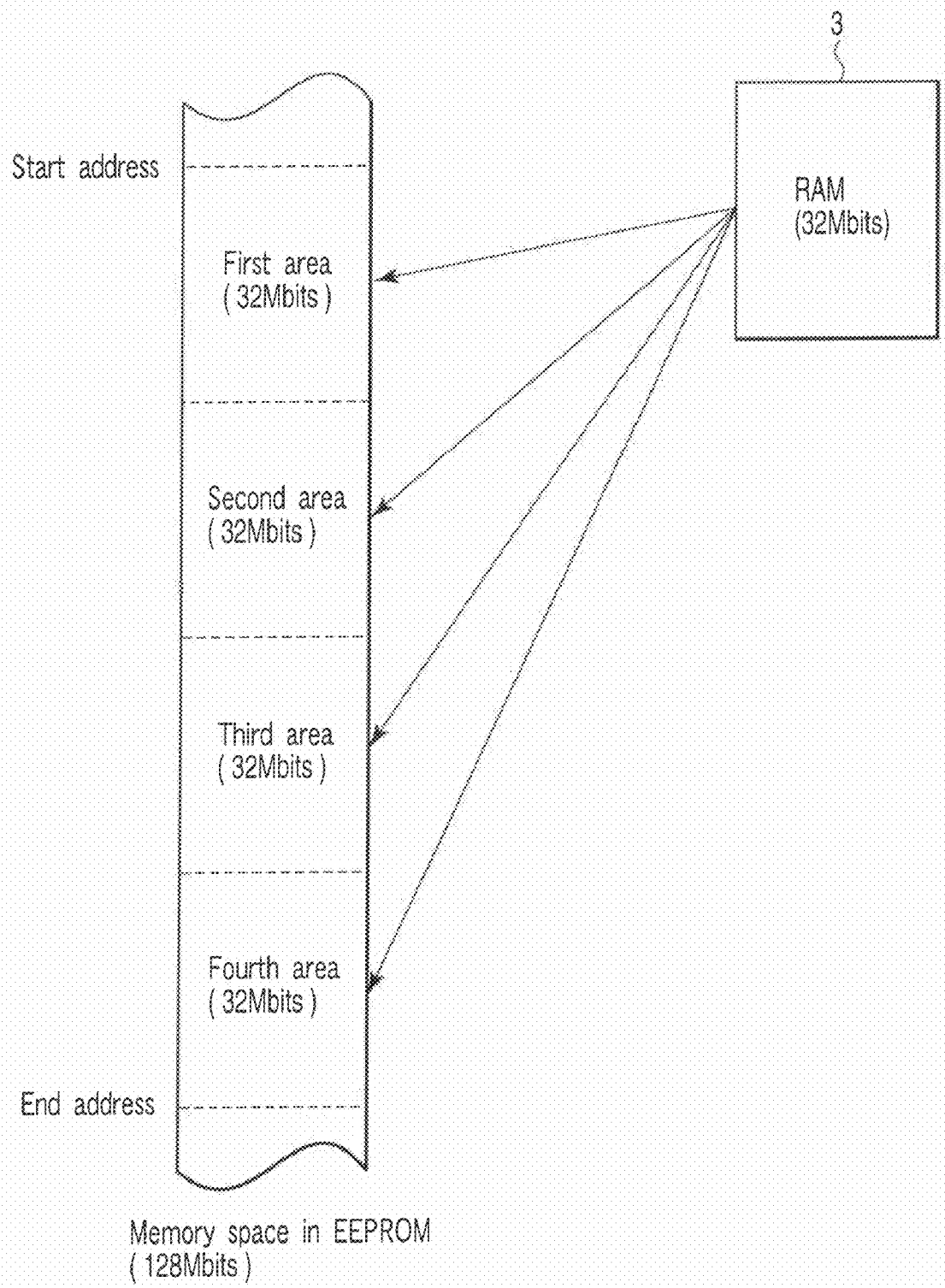
FIG. 18 is a conceptual view of the memory space of an EEPROM according to the first modification of the first to third embodiments of the present invention, and shows the way data is written in the EEPROM from a RAM 3.

Note that the EEPROM 2 itself can determine its area in which data read out from the RAM 3 is written. FIG. 18 shows this determination. FIG. 18 is a conceptual view showing the memory space in the EEPROM 2. Assume that the EEPROM 2 has 128 Mbits and the RAM 3 has 32 Mbits. Then, if the memory space of the EEPROM 2 is divided into first to fourth areas each having 32 Mbits, the EEPROM 2 can determine one of the first to fourth areas in which to write 32-Mbit data held in the RAM 3. It is, of course, also possible to give an instruction from the CPU 4.

Figure 19:
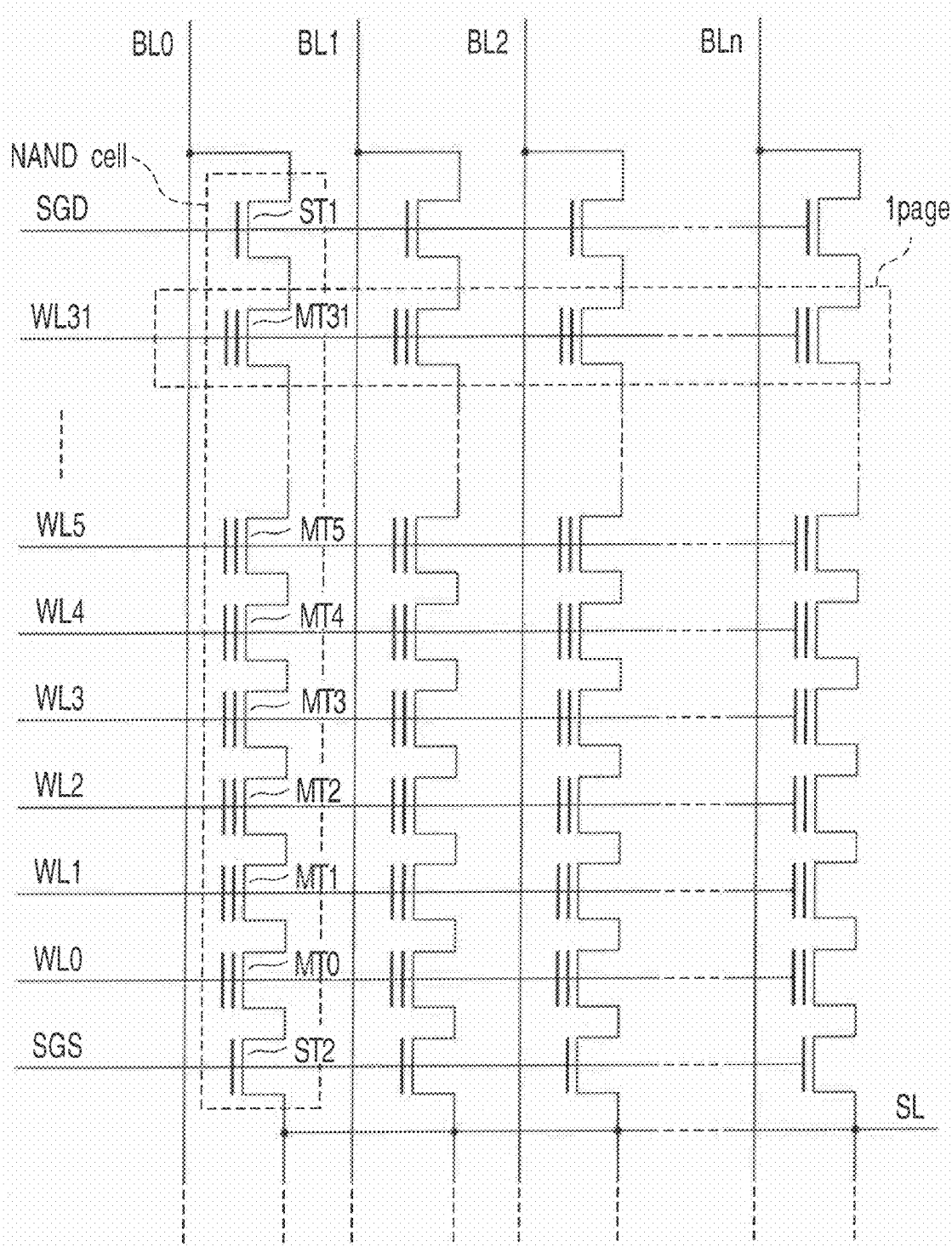
FIG. 19 is a circuit diagram of the memory cell array of an EEPROM according to the second modification of the first to third embodiments of the present invention.

Note also that the above embodiments have been explained by taking a NOR flash memory as an example of the EEPROM 2, but a NAND flash memory may also be used. FIG. 19 is a circuit diagram of a memory cell array of a NAND flash memory.

As shown in FIG. 19, the memory cell array has a plurality of NAND cells. Although FIG. 19 shows only one line of NAND cells, a plurality of lines of NAND cells may also exist. Each NAND cell includes 32 memory cell transistors MT0 to MT31 and selection transistors ST1 and ST2. For the sake of descriptive simplicity, the memory cell transistors MT0 to MT31 will also be simply called memory cell transistors MT hereinafter. The memory cell transistor MT has a stacked gate structure having a floating gate formed on a gate insulating film on a semiconductor substrate, and a control gate formed on an inter-gate insulating film on the floating gate. Note that the number of the memory cell transistors MT is not limited to 32 and can also be 8 or 16, i.e., the number is not particularly limited. Adjacent memory cell transistors MT share the source and drain. The memory cell transistors MT are arranged between the selection transistors ST1 and ST2 so as to connect the current paths in series. The drain region at one end of the series-connected memory cell transistors MT is connected to the source region of the selection transistor ST1, and the source region at the other end is connected to the drain region of the selection transistor ST2.

The control gates of the memory cell transistors MT on the same row are connected together to one of word lies WL0 to WL31, the gates of the selection transistors ST1 of memory cells on the same row are connected together to a select gate line SGD, and the gates of the selection transistors ST2 of memory cells on the same row are connected together to a select gate line SGS. Also, the drains of the selection transistors ST1 in the same column of the memory cell array are connected together to one of bit lines BL0 to BLn (n is a natural number). The sources of the selection transistors ST2 are connected together to a source line SL. Note that it is not always necessary to form both the selection transistors ST1 and ST2, and only one of them may also be formed as long as NAND cells can be selected.

The above embodiments can also be applied to the NAND flash memory as described above. In addition, the above embodiments are applicable not only to the flash memories but also to general semiconductor memories that simultaneously write data in a plurality of memory cells by using a write data buffer. Furthermore, the data size to be simultaneously written is not limited to one word, and need only be a plurality of data.

The above embodiments achieve notable effects when applied to a semiconductor memory used to hold programs in an application system. In an application system, programs are written in an EEPROM by using a ROM writer when the product is shipped. In this case, a large volume of program data is written in the EEPROM at once. In a case like this, therefore, it is desirable to apply the method of the first or second embodiment by using the ROM writer as a host apparatus.

Furthermore, the above embodiments have explained the case that the size of the write data buffer is one page. However, the size of the write data buffer need only be a data size (in the above embodiments, one word) that can be simultaneously written in memory cells. Since, however, the EEPROM 2 cannot be used together with the RAM 3 in some cases depending on the way the semiconductor chip is used, the size of the write data buffer is desirably larger than one word.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device configured to connect to an external memory device, comprising:
   a memory cell array in which a plurality of memory cells each including a charge storage layer and a control gate formed on the charge storage layer are arranged in a matrix;
   a word line which connects the control gates of the memory cells on the same row in the memory cell array;
   an output buffer which outputs, to the external memory device, an enable signal which makes the external memory device operable;
   an address buffer which outputs, to the external memory device, an address of data to be read out from the external memory device;
   an input buffer which receives the data held at the address output from the address buffer, from the external memory device made operable by the enable signal; and a write data buffer which holds the data received by the input buffer, and writes the data in the memory cells connected to the same word line at once, wherein whenever the write data buffer writes data in the memory cells, the input buffer receives, from the external memory device, the data having a size which is written in the memory cells at once.

2. The device according to claim 1, wherein the write data buffer comprises:

a first buffer circuit which temporarily holds the data received by the input buffer; and a second buffer circuit which receives the data held in the first buffer circuit, and writes the data in the memory cells, and in a period during which the data held in the second buffer circuit is written in the memory cells, the address buffer outputs, to the external memory device, an address holding the data to be written in the memory cells next in the external memory device, and the input buffer receives the data to be written next and holds the data in the first buffer circuit.

3. The device according to claim 2, which further comprises a verify circuit which verifies the data written in the memory cells, and in which in a period during which the data written in the memory cells is verified by using the data held in the second buffer circuit, the input buffer receives the data to be verified next from the external memory device, and holds the data in the first buffer circuit.

4. The device according to claim 1, which further comprises a voltage generator which generates an internal voltage for write, and in which the internal voltage is generated only once while all the data is written in the memory cells.

5. The device according to claim 1, which further comprises a verify circuit which verifies the data written in the memory cells, and in which whenever the verify circuit verifies the data in the memory cells, the input buffer receives, from the external memory device, the data having the size which is written in the memory cells at once.

6. The device according to claim 5, which further comprises a voltage generator which generates a first internal voltage for write and a second internal voltage for verify, and in which the first internal voltage is generated only once while all the data is written in the memory cells, and the second internal voltage is generated only once while all the data is verified.

7. The device according to claim 1, wherein the semiconductor memory device is an EEPROM.

8. A data write method of a semiconductor memory device configured to connect to an external memory device, and having a plurality of memory cells each having a charge storage layer and a control gate formed on the charge storage layer, the data write method comprising:

writing data having a first data size in the external memory device;

causing the semiconductor memory device to generate an execution flag indicating that a write operation is being performed, after the write to the external memory device is complete;

causing the semiconductor memory device to make the external memory device operable, after the execution flag is generated;

causing a voltage generator of the semiconductor memory device to generate a first internal voltage for write;

causing the semiconductor memory device to read out the data from the external memory device, for each second data size smaller than the first data size;

writing the data in the memory cells for each second data size by using the first internal voltage;

causing the voltage generator to generate a second internal voltage for verify, after all the data is completely written in the memory cells;

causing the semiconductor memory device to read out the data from the external memory device again for each second data size;

verifying the data written in the memory cells by using the second internal voltage and the data read out from the external memory device again; and stopping the generation of the execution flag, after all the data is completely verified.

9. The method according to claim 8, wherein the semiconductor memory device further comprises:

an address buffer which outputs, to the external memory device, an address of the data to be read out from the external memory device;

an input buffer which receives, from the external memory device, the data held at the address output from the address buffer; and a write data buffer which holds the data received by the input buffer, and writes the data in a plurality of memory cells connected to the same word line at once, and whenever the write data buffer writes the data in the memory cells, the input buffer receives, from the external memory device, the data having a size which is written in the memory cells at once.

10. The method according to claim 9, wherein whenever the data in the memory cells is verified, the input buffer receives, from the external memory device, the data having the size which is written in the memory cells at once.

11. The method according to claim 8, wherein the semiconductor memory device comprises a first buffer circuit and a second buffer circuit configured to hold the data whose data size is at least the second data size, the data held in the first buffer circuit is written in the memory cells, and while the data is written in the memory cells, the data to be written next is read out from the external memory device, stored in the second buffer circuit, and transferred to the first buffer circuit.

12. The method according to claim 11, wherein while the data written in the memory cells is verified by using the data read out from the external memory device again, the data to be verified next is read out from the external memory device and stored in the second buffer circuit.

13. The method according to claim 8, wherein the first internal voltage is generated only once while all the data is written in the memory cells, and the second internal voltage is generated only once while all the data is verified.

14. The method according to claim 8, wherein flag determination is performed only once while all the data is written in the memory cells and verified.

15. The method according to claim 8, wherein the data read out from the external memory device is written in a write area determined by the semiconductor memory device.

* * * * *